United States Patent [19]
Atsumi et al.

[11] Patent Number: 5,712,597
[45] Date of Patent: Jan. 27, 1998

[54] RUBIDIUM ATOM OSCILLATOR WITH TEMPERATURE STABILIZED FREQUENCY OUTPUT

[75] Inventors: Ken Atsumi, Sendai; Yoshifumi Nakajima; Yoshito Koyama, both of Kawasaki, all of Japan

[73] Assignee: Fujitsu Limited, Kanagawa, Japan

[21] Appl. No.: 618,490

[22] Filed: Mar. 19, 1996

[30] Foreign Application Priority Data

Aug. 11, 1995 [JP] Japan ............................... 7-206257

[51] Int. Cl.⁶ .................. H03L 1/02; H03L 7/26
[52] U.S. Cl. .................. 331/94.1; 331/3; 331/176
[58] Field of Search ............... 331/3, 94.1, 176

[56] References Cited

U.S. PATENT DOCUMENTS

| | | | |
|---|---|---|---|
| 3,798,565 | 3/1974 | Jechart | 331/3 |
| 4,456,891 | 6/1984 | Fowks | 331/94.1 |
| 4,476,445 | 10/1984 | Riley, Jr. | 331/94.1 |

FOREIGN PATENT DOCUMENTS

| | | |
|---|---|---|
| 0094834 | 11/1983 | European Pat. Off. |
| 59-212034 | 11/1984 | Japan |
| 875242 | 8/1961 | United Kingdom |
| 1384809 | 2/1975 | United Kingdom |

*Primary Examiner*—Siegfried H. Grimm
*Attorney, Agent, or Firm*—Helfgott & Karas, P.C.

[57] ABSTRACT

A rubidium atom oscillator has an increased allowable temperature range in which a frequency fluctuation due to change in the ambient temperature is suppressed. The frequency is stabilized in an increased temperature range as compared to the conventional rubidium atom oscillator. The rubidium atom oscillator oscillates a microwave having a predetermined stable frequency by using an optical pumping effect of rubidium gas. A rubidium lamp radiates a resonance light. A cavity resonator accommodates a gas cell containing rubidium gas and a photodetector detecting an amount of the resonance light passing through the gas cell. It is determined whether or not an ambient temperature of the cavity resonator is within a predetermined temperature range between a lower-limit temperature and an upper-limit temperature. A temperature correction signal is generated based on the determination. A current determined by the temperature correction signal is supplied to a coil surrounding the cavity resonator. The coil generates a magnetic field in the cavity resonator so as to change a resonance frequency of the cavity resonator.

10 Claims, 17 Drawing Sheets

RUBIDIUM ATOM OSCILLATOR WITH TEMPERATURE STABILIZED FREQUENCY OUTPUT

BACKGROUND OF THE INVENTION

1. Field of the Invention

The present invention generally relates to a rubidium atom oscillator, and more particularly to a rubidium atom oscillator using an optical pumping.

A rubidium atom oscillator oscillates a microwave having an extremely stable frequency by using an energy level transition of rubidium atoms. The rubidium atom oscillator is useful as, for example, a clock source of a synchronization network or a standard frequency source of broadcasting or navigation apparatus.

2. Description of the Related Art

FIG. 1 is an illustration of a construction of a conventional rubidium atom oscillator. In FIG. 1, a rubidium lamp 11 of a lamp block 10 is heated by a microwave heater 12 and generates light. A cavity resonator 14 has therein a gas cell 15 which contains rubidium atoms. The resonance frequency of the cavity resonator 14 is equalized to the resonance frequency of the rubidium atoms. A photodetector 16 in the cavity resonator 14 detects resonance light passing through the gas cell 15. The lamp block 10 and the cavity resonator 14 together constitute an optical microwave unit (OMU).

The cavity resonator 14 is surrounded by a C-field coil 18 which generates a static magnetic field in the gas cell 15. A C-field current circuit 19 supplies a current to the C-field coil 18. An output signal output from a voltage controlled quartz oscillator (VCXO) 20 is subjected to a phase modulation in a frequency synthesizing circuit 21. The phase modulation is performed based on a low-frequency signal $f_1$ generated by a low-frequency oscillator provided in a servo circuit 22. A phase modulated wave signal generated by the frequency synthesizing circuit 21 is supplied to a varactor diode 23. The varactor diode 23 generates a microwave which is a high-order harmonic wave. The microwave excites the cavity resonator 14.

An electric signal output by the photodetector has a frequency of $f_1$. The electric signal is amplified by an amplifier provided in the servo circuit 22, and then detected in synchronization with the output signal of the low-frequency oscillator. The synchronized detection output is integrated and fed back to the VCXO 20. Thus, the frequency of the output of the VCXO 20 is controlled.

FIG. 2 is an illustration for explaining a principle of an operation of the rubidium atom oscillator. The rubidium atoms in the gas cell 15 are initially in a ground state which is a thermal equilibrium state. In the ground state, atoms have an equal probability of existing in the energy level of 5 S, F=1 or the energy level of 5 S, F=2. When the atoms are subjected to an optical pumping by the resonance light of the rubidium lamp, only the atoms having the energy level of 5 S, F=1 are excited to the energy level of 5 P.

However, this state of the atoms is unstable, and the atoms return to the ground state due to natural emission. At this time, the atoms are as likely to return to the energy level of 5 S, F=1 as the energy level of 5 S, F=2. Thus, eventually, all rubidium atoms are in the same energy level of 5 S, F=2 when the excitation and emission are repeated. This state is a negative temperature state.

When the microwave generated by the VCXO 20 is radiated to the rubidium atoms in such a state, the atoms having the energy level of 5 S, F=2 transit to the energy level of 5 S, F=1 due to stimulated emission. The rubidium atoms absorb light when the rubidium atoms transit from the energy level of 5 S, F=2 to the energy level of 5 S, F=1. Thus, an amount of light detected by the photodetector 15 is decreased. In this case, the probability of transition from the energy level of 5 S, F=2 to the energy level of S5, F=1 is maximum when the frequency of the microwave is equal to the transition frequency corresponding to the energy levels of 5 S, F=2 and 5 S, F=1. The probability varies in response to a difference between the frequency of the microwave and the transition frequency.

Accordingly, the variation in the output of the photodetector due to variation in the frequency of the microwave has a V-shaped characteristic with the transition frequency being the minimum value. Thus, the microwave having a frequency equal to the transition frequency is obtained by controlling the frequency by applying a phase modulation to the microwave signal with a low-frequency signal and feeding back a signal obtained by synchronously detecting the output of the photodetector with the low-frequency signal.

A temperature controlling circuit 25 senses a temperature of the lamp cell 10 so as to control a current supplied to a heater 26 so that the temperature of the lamp cell 10 is maintained to be constant. A temperature controlling circuit 27 senses an ambient temperature so as to supply a current to a heater 29 by controlling a transistor TR1 so that the temperature of the gas cell 15 is maintained to be constant.

An allowable range of the ambient temperature of the rubidium atom oscillator, in which range the rubidium atom oscillator is normally operated, is determined by a power consumption characteristic of the heater 29. That is, the upper-limit temperature is limited to the temperature of the gas cell 15. Practically, the upper-limit temperature is 5° C.–10° C. less than the temperature of the gas cell 15 due to heat generated by parts surrounding the gas cell 15. The lower-limit temperature is determined by the maximum power consumption of the heater 29. The maximum power consumption is represented by $P_{max} = V^2 / R_H$, where V is a voltage supplied to the heater 29 and $R_H$ is a resistance of the heater 29.

FIG. 3A is a graph showing a power consumption characteristic of the heater 29, and FIG. 3B is a graph showing a frequency fluctuation characteristic of the rubidium atom oscillator. In the conventional rubidium atom oscillator, if the ambient temperature is out of a normal operation temperature range $T_L$ to $T_H$, for example, –15° C. to 70° C., the frequency fluctuates remarkably. This influences a system using the rubidium atom oscillator.

Additionally, the amount of light from the rubidium lamp 11 is decreased due to aging of the rubidium lamp. That is, the amount of light of the rubidium lamp 11 is decreased since the rubidium reacts with a glass of the lamp cell 10. A frequency change of the conventional rubidium oscillator is about an order of $1 \times 10^{-11}$ Hz/month to $3 \times 10^{-11}$ Hz/month. The main cause of the frequency change is the decrease in the amount of light from the rubidium lamp 11.

SUMMARY OF THE INVENTION

It is a general object of the present invention to provide an improved and useful rubidium atom oscillator in which the above-mentioned problems are eliminated.

A more specific object of the present invention is to provide a rubidium atom oscillator having an increased allowable temperature range in which a frequency fluctuation due to change in the ambient temperature is suppressed, and a frequency is stabilized in an increased temperature range as compared to the conventional rubidium atom oscillator.

Another object of the present invention is to provide a rubidium atom oscillator having a long service life without a frequency change due to aging.

In order to achieve the above-mentioned objects, there is provided according to one aspect of the present invention a rubidium atom oscillator oscillating a microwave having a predetermined stable frequency by using an optical pumping effect of rubidium gas, the rubidium atom oscillator comprising:

a rubidium lamp radiating a resonance light;

a cavity resonator accommodating a gas cell containing rubidium gas and a photodetector detecting an amount of the resonance light passing through the gas cell;

temperature determining means for determining whether or not an ambient temperature of the cavity resonator is within a predetermined temperature range between a lower-limit temperature and an upper-limit temperature;

temperature correction signal generating means for generating a temperature correction signal based on a determination of the temperature determining means; and current supplying means for supplying a current determined by the temperature correction signal to a coil surrounding the cavity resonator, the coil generating a magnetic field in the cavity resonator.

According to the above-mentioned invention, field intensity of the static magnetic field is varied in accordance with the ambient temperature when the ambient temperature is out of a normal operation temperature range which is set as the predetermined temperature range having the upper-limit temperature and the lower-limit temperature. Thus, the resonance frequency of the cavity resonator can be varied to correct a frequency shift due to a change in the ambient temperature outside the normal operation temperature range.

In one embodiment of the present invention, the temperature determining means comprises a temperature sensing circuit and comparing means, the temperature sensing circuit generating a temperature signal having a voltage responsive to the ambient temperature sensed by a temperature sensor, the comparing means comparing the temperature signal with predetermined voltage values corresponding to the upper-limit temperature and the lower-limit temperature so as to determine whether the ambient temperature is within the predetermined temperature range.

The comparing means may comprise a first comparator and a second comparator, the first comparator comparing the temperature signal with the voltage value corresponding to the lower-limit temperature, the second comparator comparing the temperature signal with the voltage value corresponding to the upper-limit temperature.

In another embodiment of the present invention, the rubidium atom oscillator further comprises a heater heating the cavity resonator by being supplied with a voltage responsive to the ambient temperature. The temperature determining means comprises comparing means comparing the voltage supplied to the heater with predetermined voltage values corresponding to the upper-limit temperature and the lower-limit temperature so as to determine whether the ambient temperature is within the predetermined temperature range. The comparing means may comprise a first comparator and a second comparator, the first comparator comparing the voltage supplied to the heater with the voltage value corresponding to the lower-limit temperature, the second comparator comparing the voltage supplied to the heater with the voltage value corresponding to the upper-limit temperature.

In another embodiment of the present invention, the temperature determining means may comprise thermal switch means which is operated at the lower-limit temperature and the upper-limit temperature. The thermal switch means may comprise a first thermal switch and a second thermal switch, the first thermal switch being conductive when the ambient temperature is below the lower-limit temperature, the second thermal switch being conductive when the ambient temperature exceeds the upper-limit temperature.

In another embodiment of the present invention, the temperature determining means and the temperature correction signal generating means together constitute storing means for storing data of the temperature correction signal for various ambient temperatures. The temperature correction signal corresponding to the ambient temperature is output from the storing means.

In another embodiment of the present invention, the temperature correction signal generating means comprises a first correction circuit and a second correction circuit, the first correction circuit generating a first temperature correction signal when the ambient temperature exceeds the upper-limit temperature, the second correction circuit generating a second temperature correction signal when the ambient temperature is below the lower-limit temperature.

In another embodiment of the present invention, the temperature correction signal generating means comprises a correction circuit and an inverting amplifier, the correction circuit generating the temperature correction signal, the inverting amplifier inverting and amplifying the temperature correction signal when the ambient temperature exceeds the upper-limit temperature.

In another embodiment of the present invention, the temperature correction signal generating means comprises a correction circuit and an inverting amplifier, the correction circuit generating the temperature correction signal, the inverting amplifier inverting and amplifying the temperature correction signal when the ambient temperature is below the lower-limit temperature.

In the above-mentioned embodiments, the coil to which the current is supplied by the current supplying means may be a C-field coil provided for generating a static magnetic field in the gas cell. In an alternative case, the coil to which the current is supplied by the current supplying means is a coil separated from a C-field coil provided for generating a static magnetic field in the gas cell.

Additionally, there is provided according to another aspect of the present invention a rubidium atom oscillator oscillating a microwave having a predetermined stable frequency by using an optical pumping effect of rubidium gas, the rubidium atom oscillator comprising:

a rubidium lamp radiating a resonance light;

a cavity resonator accommodating a gas cell containing rubidium gas and a photodetector detecting an amount of the resonance light passing through the gas cell;

light amount correction signal generating means for generating a correction signal based on the amount of the resonance light passing through the gas cell; and current supplying means for supplying a current determined by the correction signal to a coil surrounding the cavity resonator, the coil generating a magnetic field in the cavity resonator.

According to this invention, the static magnetic field generated in the cavity resonator is varied in accordance with the amount of light passing through the gas cell. Thus, if the amount of light passing through the gas cell is decreased, a field intensity of the static magnetic field can be changed so as to correct a frequency shift due to the decrease in the resonant light radiated by the rubidium lamp. Thus, the frequency change due to aging can be eliminated.

The coil to which the current is supplied by the current supplying means may be a C-field coil provided for generating a static magnetic field in the gas cell. In an alternative case, the coil to which the current is supplied by the current supplying means may be a coil separated from a C-field coil provided for generating a static magnetic field in the gas cell.

Additionally, there is provided according to another aspect of the present invention a rubidium atom oscillator oscillating a microwave having a predetermined stable frequency by using an optical pumping effect of rubidium gas, the rubidium atom oscillator comprising:

a rubidium lamp radiating a resonance light;

a cavity resonator accommodating a gas cell containing rubidium gas and a photodetector detecting an amount of the resonance light passing through the gas cell; and lamp excitation voltage controlling means for controlling a voltage supplied to a high-frequency heater which excites the rubidium lamp, the voltage being controlled based on the amount of the resonance light passing through the gas cell.

According to this invention, the voltage supplied to the high-frequency heater exciting the rubidium lamp is varied in accordance with the amount of light passing through the gas cell. Thus, if the amount of light passing through the gas cell is decreased, the voltage supplied to the high-frequency heater can be changed so as to correct a frequency shift due to the decrease in the resonant light radiated by the rubidium lamp. Thus, the frequency change due to aging can be eliminated.

Other objects, features and advantages of the present invention will become more apparent from the following detailed description when read in conjunction with the accompanying drawings.

DETAILED DESCRIPTION OF THE PREFERRED EMBODIMENTS

Figure 1:
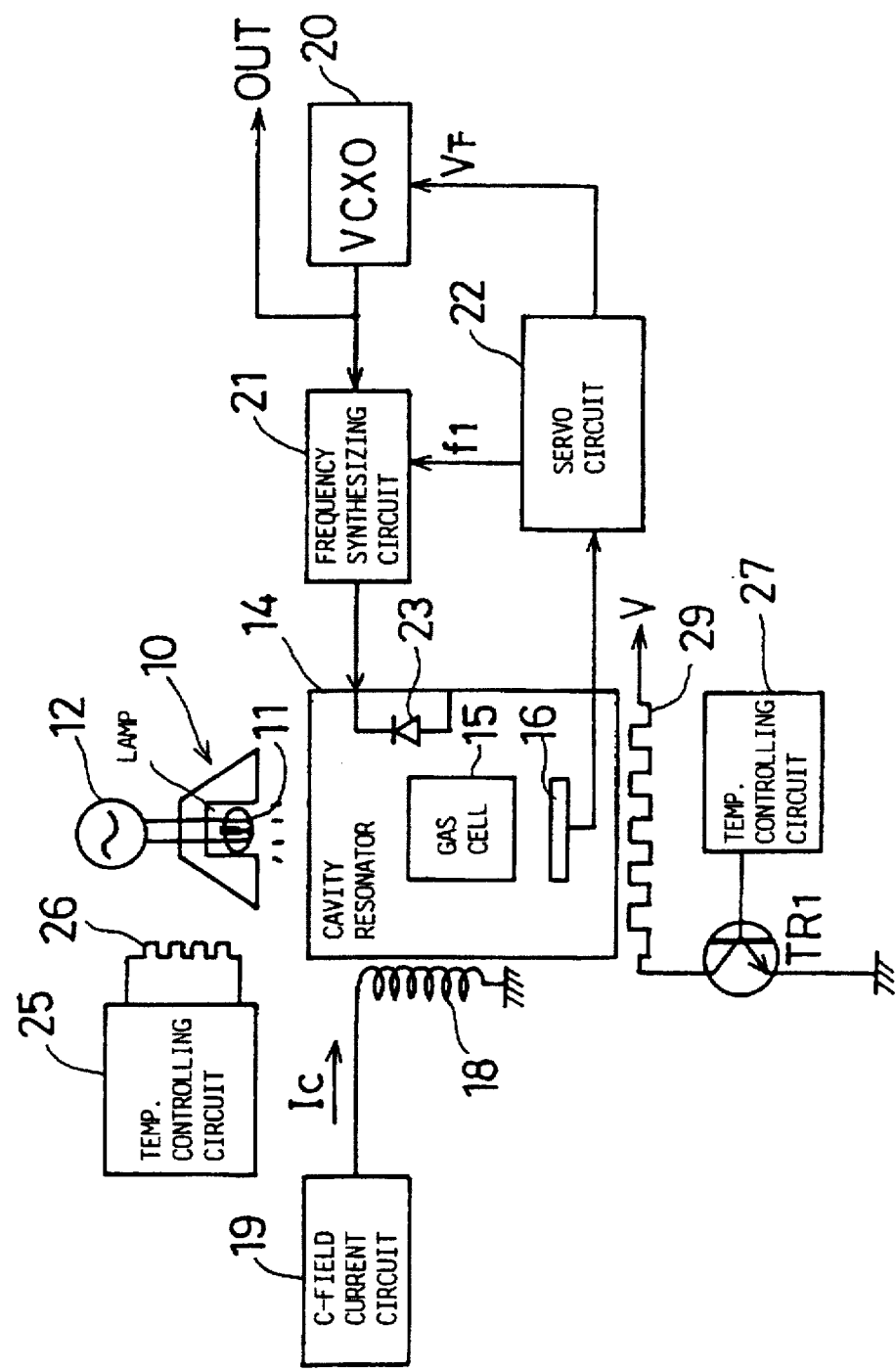
FIG. 1 is an illustration of a structure of a conventional rubidium atom oscillator.
Figure 2:
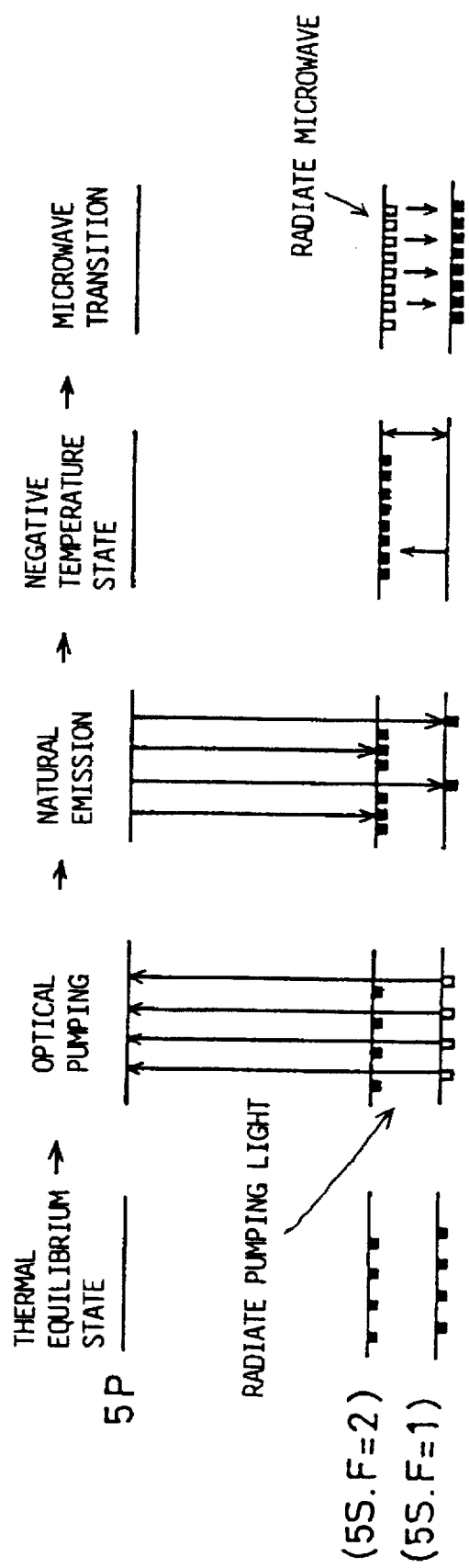
FIG. 2 is an illustration for explaining a principle of an operation of the rubidium atom oscillator shown in FIG. 1.
Figure 3A:
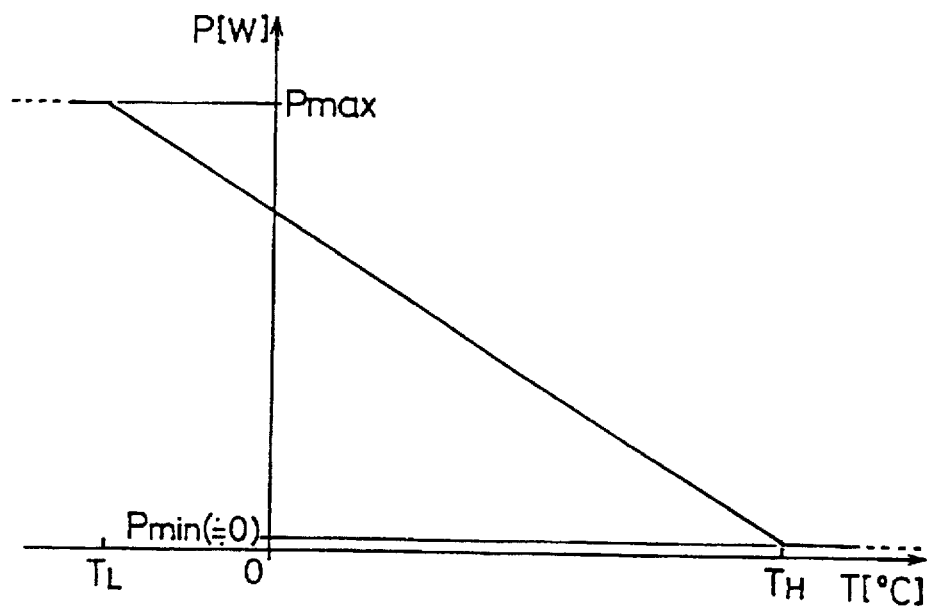
FIG. 3A is a graph showing a power consumption characteristic of a heater shown in FIG. 1.
Figure 3B:
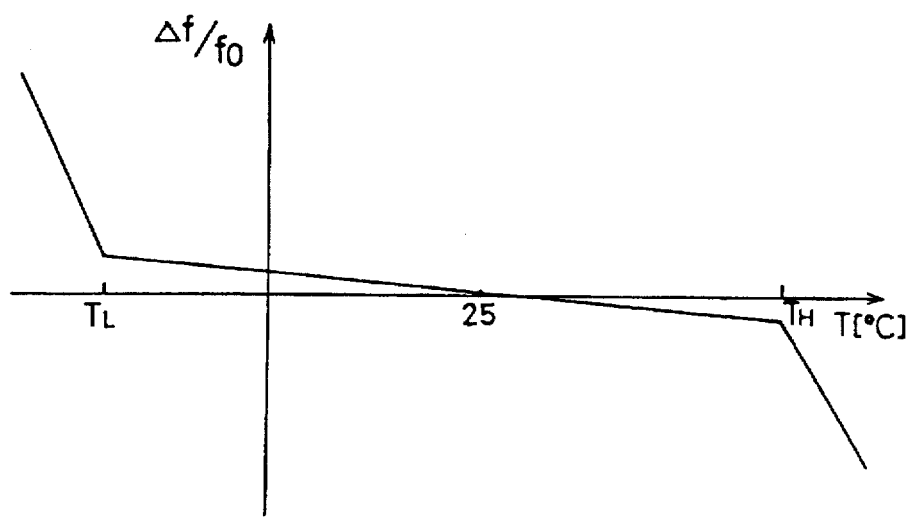
FIG. 3B is a graph showing a frequency fluctuation characteristic of the rubidium atom oscillator shown in FIG. 1.
Figure 4:
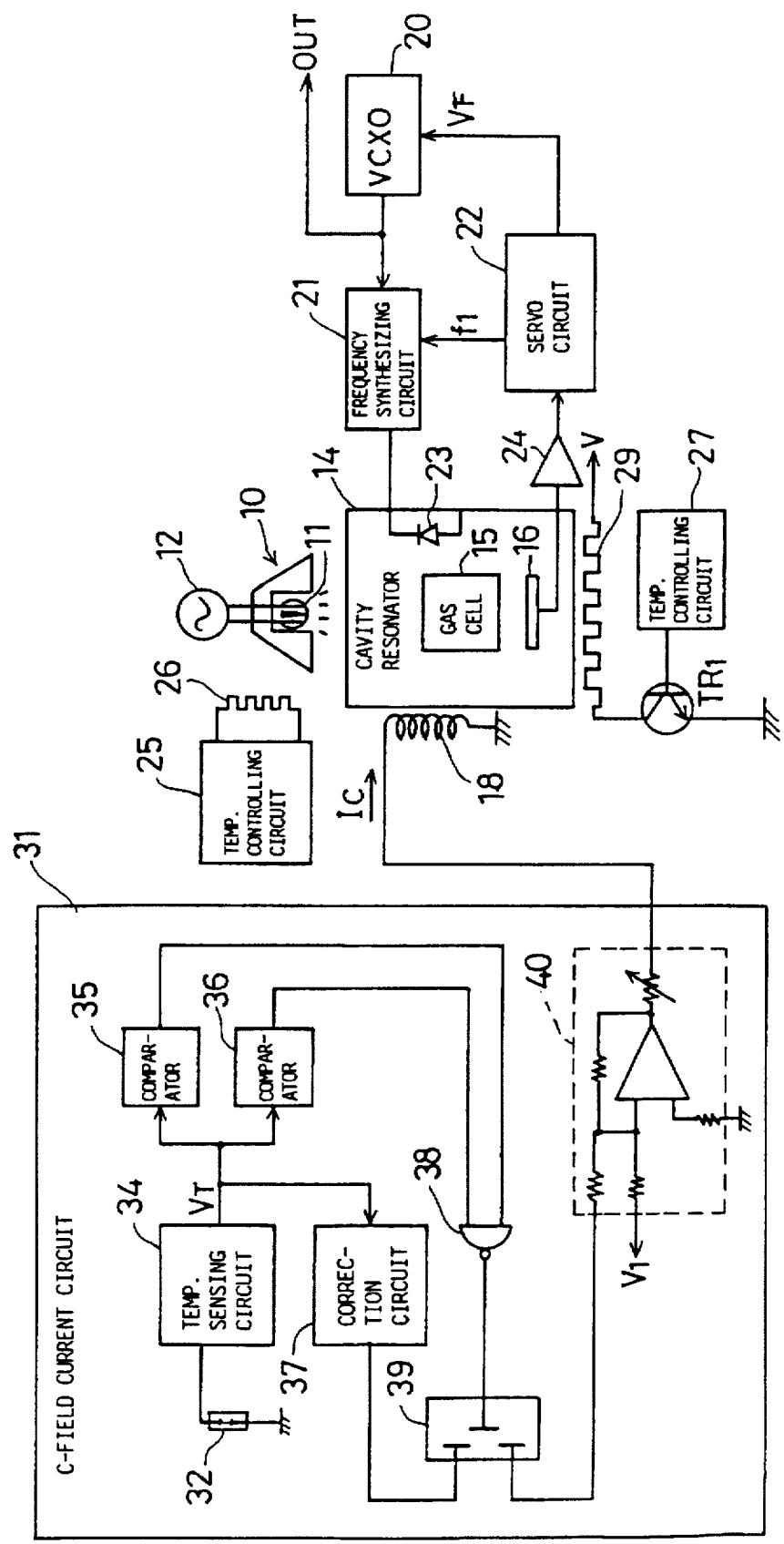
FIG. 4 is an illustration of a structure of a rubidium atom oscillator according to a first embodiment of the present invention.

A description will now be given of a rubidium atom oscillator according to a first embodiment of the present invention. FIG. 4 is an illustration of a structure of the rubidium atom oscillator according to the first embodiment of the present invention. In FIG. 4, parts that are the same as the parts shown in FIG. 1 are given the same reference numerals.

In FIG. 4, the rubidium lamp 11 of the lamp block 10 generates a resonant light due to heating by the high-frequency source 12. The cavity resonator 14 has therein the gas cell 15 which contains rubidium atoms. The resonance frequency of the cavity resonator 14 is equalized to the resonance frequency of the rubidium atoms. The photodetector 16 in the cavity resonator 14 detects resonance light passing through the gas cell 15. The lamp block 10 and the cavity resonator 14 together constitute an optical microwave unit (OMU).

The cavity resonator 14 is surrounded by the C-field coil 18 which generates a static magnetic field in the gas cell 15. A C-field current circuit 31 supplies a current to the C-field coil 18. An output signal output from the voltage controlled quartz oscillator (VCXO) 20 is subjected to a phase modulation in the frequency synthesizing circuit 21. The phase modulation is performed based on a low-frequency signal $f_1$ generated by a low-frequency oscillator provided in a servo circuit 22. A phase modulated wave signal generated by the frequency synthesizing circuit 21 is supplied to a varactor diode 23. The varactor diode 23 generates a microwave which is a high-order harmonic wave. The microwave excites the cavity resonator 14.

An electric signal output by the photodetector 23 has a frequency of $f_1$. The electric signal is amplified by an amplifier 24, and supplied to the servo circuit 22, and then detected in synchronization with the output signal of the low-frequency oscillator. The synchronized detection output is integrated and fed back to the VCXO 20. Thus, the frequency of the output of the VCXO 20 is controlled.

The temperature controlling circuit 25 senses a temperature of the lamp cell 10 so as to control a current supplied to the heater 26 so that the temperature of the lamp cell 10 is maintained to be constant. The temperature controlling circuit 27 senses an ambient temperature so as to supply a current to the heater 29 by controlling the transistor TR1 so that the temperature of the gas cell 15 is maintained to be constant. For example, the temperature controlling circuit 27 sets the temperature of the gas cell 15 to be 70° C. when the lower-limit temperature $T_L$ of the ambient temperature range is $-15°$ C. and the upper-limit temperature $T_H$ of the ambient temperature range is 60° C.

Figure 5:
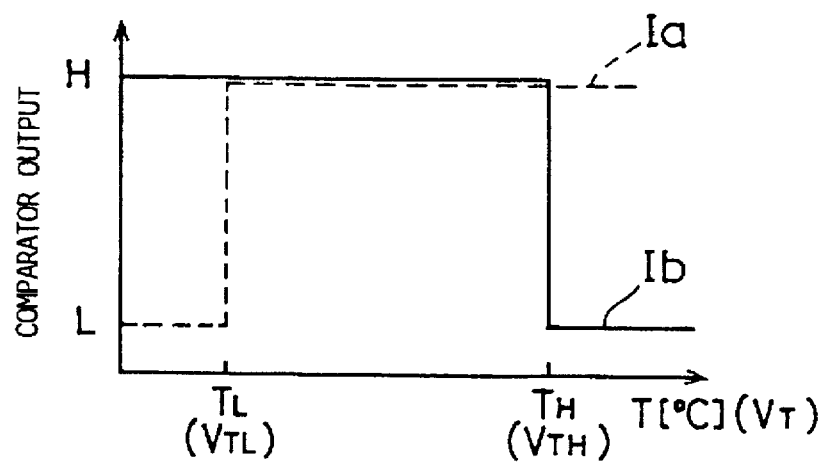
FIG. 5 is a graph showing levels of output signals from comparators shown in FIG. 4.

A temperature sensing circuit 34 in the C-field current circuit 31 outputs a signal having a voltage $V_T$ which is responsive to the ambient temperature sensed by a temperature sensor 32 such as a thermistor. The signal output from the temperature sensing circuit may be hereinafter referred to as a temperature signal $V_t$. The temperature signal $V_t$ is supplied to comparators 35 and 36 and a correction circuit 37. The comparator 35 generates an output signal in accordance with the temperature signal $V_t$. As indicated by a dotted line Ia in FIG. 5, the output signal of the comparator 35 is at a low level when the temperature signal $V_t$ is less than a predetermined voltage $V_{TL}$ and the ambient temperature is below the lower-limit temperature $T_L$. The comparator 36 generates an output signal in accordance with the temperature signal $V_t$. As indicated by a solid line Ib in FIG. 5, the output signal of the comparator 36 is at a low level when the temperature signal $V_t$ is greater than a predetermined voltage $V_{TH}$ and the ambient temperature exceeds the upper-limit temperature $T_H$. The temperature sensor 32, the temperature sensing circuit 34 and the comparators 35 and 36 together constitute temperature determining means.

The output signals from the comparators 35 and 36 are supplied to a NAND circuit 38. The NAND circuit 38 generates a switching signal which is turned to a high level when only one of the output signals from the comparators 35 and 36 is at the low level. The switching signal is supplied to the analog switch 39. The analog switch 39 becomes conductive when the high-level switching signal is input from the NAND circuit 38 so as to supply an output of the correction circuit 37 to an adder 40. The correction circuit 37 as means for generating a temperature correcting signal generates a correction signal having a voltage responsive to the temperature signal $V_t$. The correction signal is supplied to the adder 40 via the analog switch 39 when the ambient temperature exceeds the upper-limit temperature $T_H$ or the ambient temperature is below the lower-limit temperature $T_L$.

Figure 6:
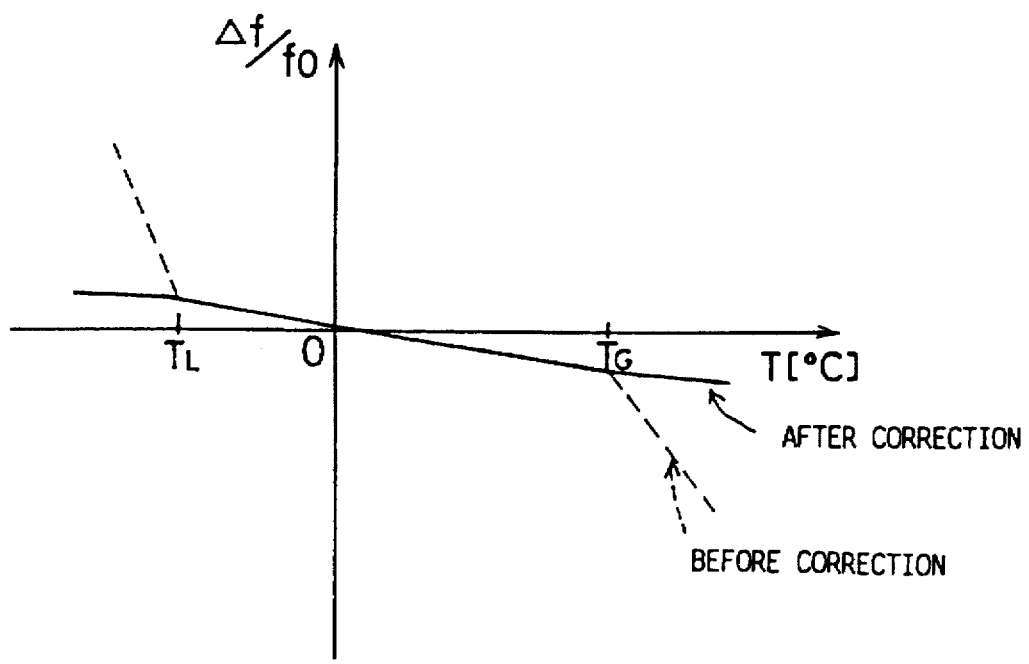
FIG. 6 is a graph showing a frequency change when an ambient temperature is varied.

The adder 40 supplies a constant current determined by an input voltage $V_1$ to the C-field coil 18 when the ambient temperature is within the temperature range from the lower-limit temperature $T_L$ to the upper-limit temperature $T_H$. Thus, the static magnetic field in the cavity resonator 14 is maintained to be constant. If the ambient temperature exceeds the upper-limit temperature $T_H$ or the ambient temperature is below the lower-limit temperature $T_L$, the adder 40 supplies to the C-field coil 18 a current determined by a value obtained by adding a correction signal voltage to the input voltage $V_1$. Thus, the static magnetic field in the cavity resonator 14 is varied to shift the resonance frequency. Thus, as indicated by a solid line in FIG. 6, the frequency change outside the normal operation temperature range from $T_L$ to $T_H$ is suppressed. It should be noted that a dotted line in FIG. 6 shows the frequency change when the correction is not performed.

Figure 7B:
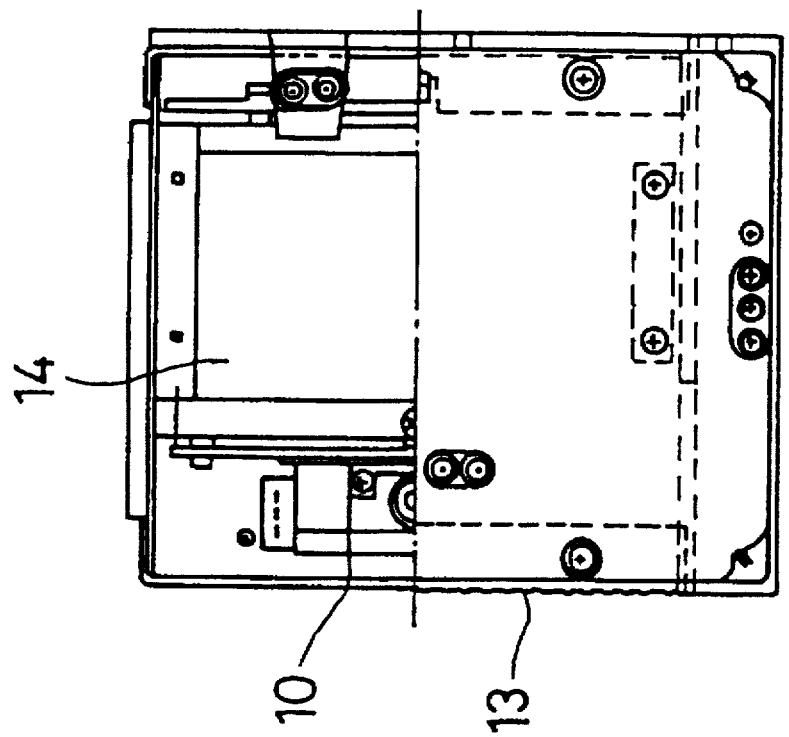
FIG. 7B is a partially cut-away side view of the rubidium atom oscillator shown in FIG. 7A.
Figure 7A:
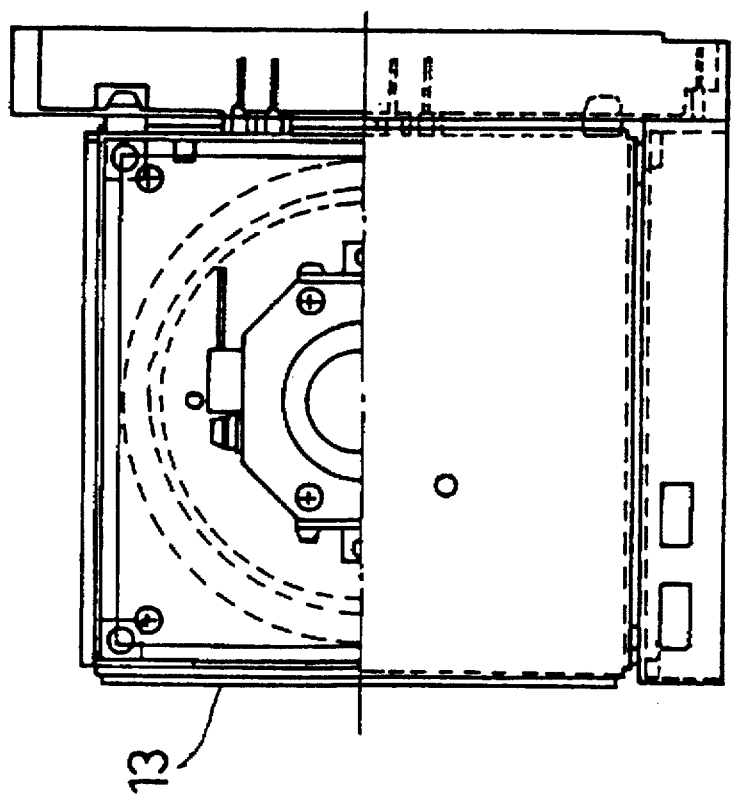
FIG. 7A is a partially cut-away plan view of the rubidium atom oscillator shown in FIG. 1.

FIG. 7A is a partially cut-away plan view of the rubidium atom oscillator shown in FIG. 1. FIG. 7B is a partially cut-away side view of the rubidium atom oscillator shown in FIG. 7A. The lamp block 10 is shown in FIG. 7A, and the lamp block 10 and the cavity resonator 14 are shown in FIG. 7B. The parts of the rubidium atom oscillator are accommodated in a case 13.

As discussed above, the static magnetic field in the cavity resonator 14 is varied in response to the ambient temperature when the ambient temperature is out of the normal operation temperature range so as to shift the resonance frequency. Thus, the frequency change outside the normal operation temperature range is suppressed. Additionally, since the frequency change is controlled by using the C-field coil which is already provided in the conventional rubidium atom oscillator, a number of coils provided in the rubidium atom oscillator according to the present embodiment is not increased.

Figure 8:
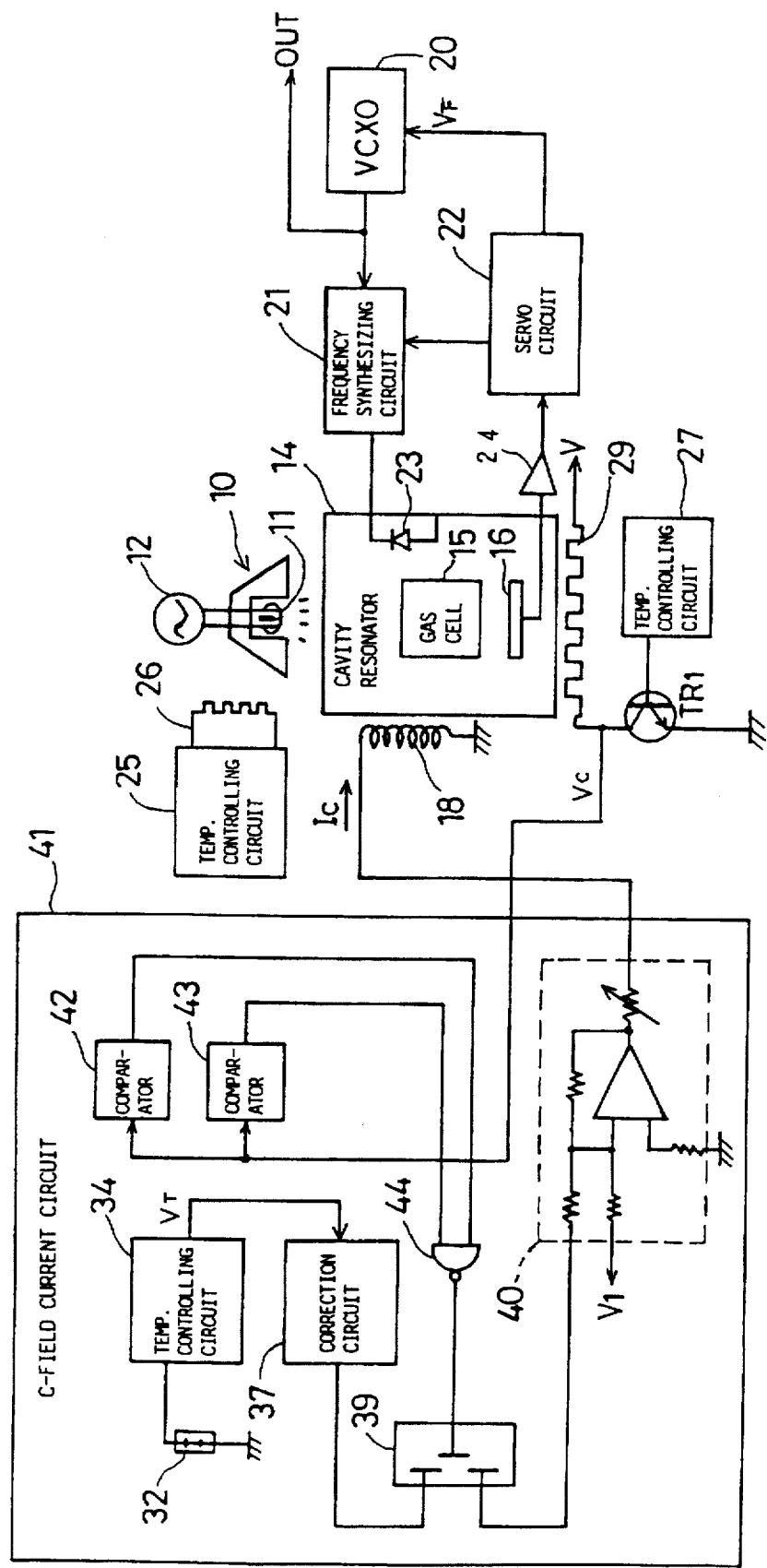
FIG. 8 is an illustration of a structure of a rubidium atom oscillator according to a second embodiment of the present invention.

A description will now be given, with reference to FIG. 8, of a second embodiment of the present invention. FIG. 8 is an illustration showing a structure of a rubidium atom oscillator according to the second embodiment of the present invention. In FIG. 8, parts that are the same as the parts shown in FIG. 4 are given the same reference numerals, and descriptions thereof will be omitted.

Figure 9:
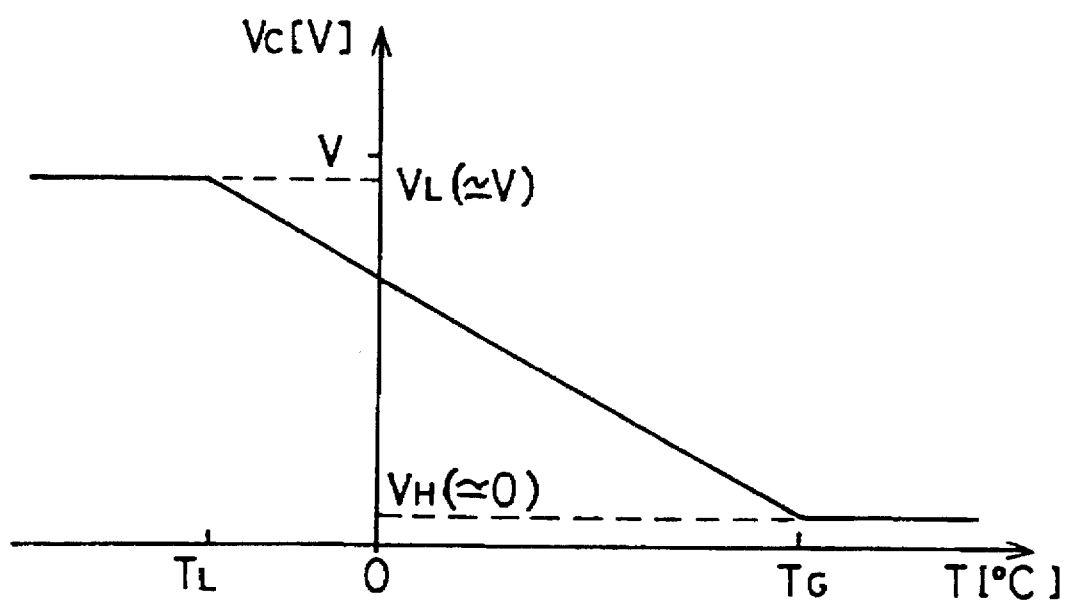
FIG. 9 is a graph showing a variation in a collector voltage when an ambient temperature is varied.

In this embodiment, a change in the ambient temperature is sensed from a collector voltage $V_c$ of the transistor TR1. As shown in FIG. 9, the collector voltage $V_c$ is $V_L$ (nearly equal to V) when the ambient temperature is below the lower-limit temperature $T_L$, and the collector voltage $V_c$ is $V_H$ (nearly equal to 0) when the ambient temperature exceeds the upper-limit temperature $T_H$. The collector voltage $V_c$ is supplied to comparators 42 and 43 provided in a C-field current circuit 41.

The temperature sensing circuit 34 in the C-field current circuit 41 outputs the temperature signal $V_t$ having the voltage $V_T$ which is responsive to the ambient temperature sensed by the temperature sensor 32. The temperature signal $V_t$ is supplied to the correction circuit 37. The comparator 42 generates an output-signal in accordance with the collector voltage $V_c$. That is, as indicated by the dotted line Ia in FIG. 5, the output signal from the comparator 42 is at a low level when the collector voltage $V_c$ of the transistor TR1 is equal to the voltage $V_L$ and the ambient temperature is below the lower-limit temperature $T_L$. The comparator 43 generates an output signal in accordance with the collector voltage $V_c$. As indicated by the solid line Ib in FIG. 5, the output signal from the comparator 43 is at a low level when the collector voltage $V_c$ of the transistor TR1 is equal to the voltage $V_H$ and the ambient temperature exceeds the upper-limit temperature $T_H$.

The output signals from the comparators 42 and 43 are supplied to a NAND circuit 44. The NAND circuit 44 generates a switching signal which is turned to a high-level when only one of the output signals from the comparators 42 and 43 is at the low level. The switching signal is supplied to the analog switch 39. The analog switch 39 becomes conductive when the high level switching signal is input from the NAND circuit 44 so as to supply an output of the correction circuit 37 to the adder 40. The correction circuit 37 generates a correction signal having a voltage responsive to the temperature signal $V_t$. The correction signal is supplied to the adder 40 via the analog switch 39 when the ambient temperature exceeds the upper-limit temperature $T_H$ or the ambient temperature is below the lower-limit temperature $T_L$.

The adder 40 supplies a constant current determined by an input voltage $V_1$ to the C-field coil 18 when the ambient temperature is within the temperature range from the lower-limit temperature $T_L$ to the upper-limit temperature $T_H$. Thus, the static magnetic field in the cavity resonator 14 is maintained to be constant. If the ambient temperature exceeds the upper-limit temperature $T_H$ or the ambient temperature is below the lower-limit temperature $T_L$, the adder 40 supplies to the C-field coil 18 a current determined by a value obtained by adding a correction signal voltage to the input voltage $V_1$. Thus, the static magnetic field in the cavity resonator 14 is varied to shift the resonance frequency. Thus, as indicated by the solid line in FIG. 6, the frequency change outside the normal operation temperature range from $T_L$ to $T_H$ is suppressed.

Figure 10:
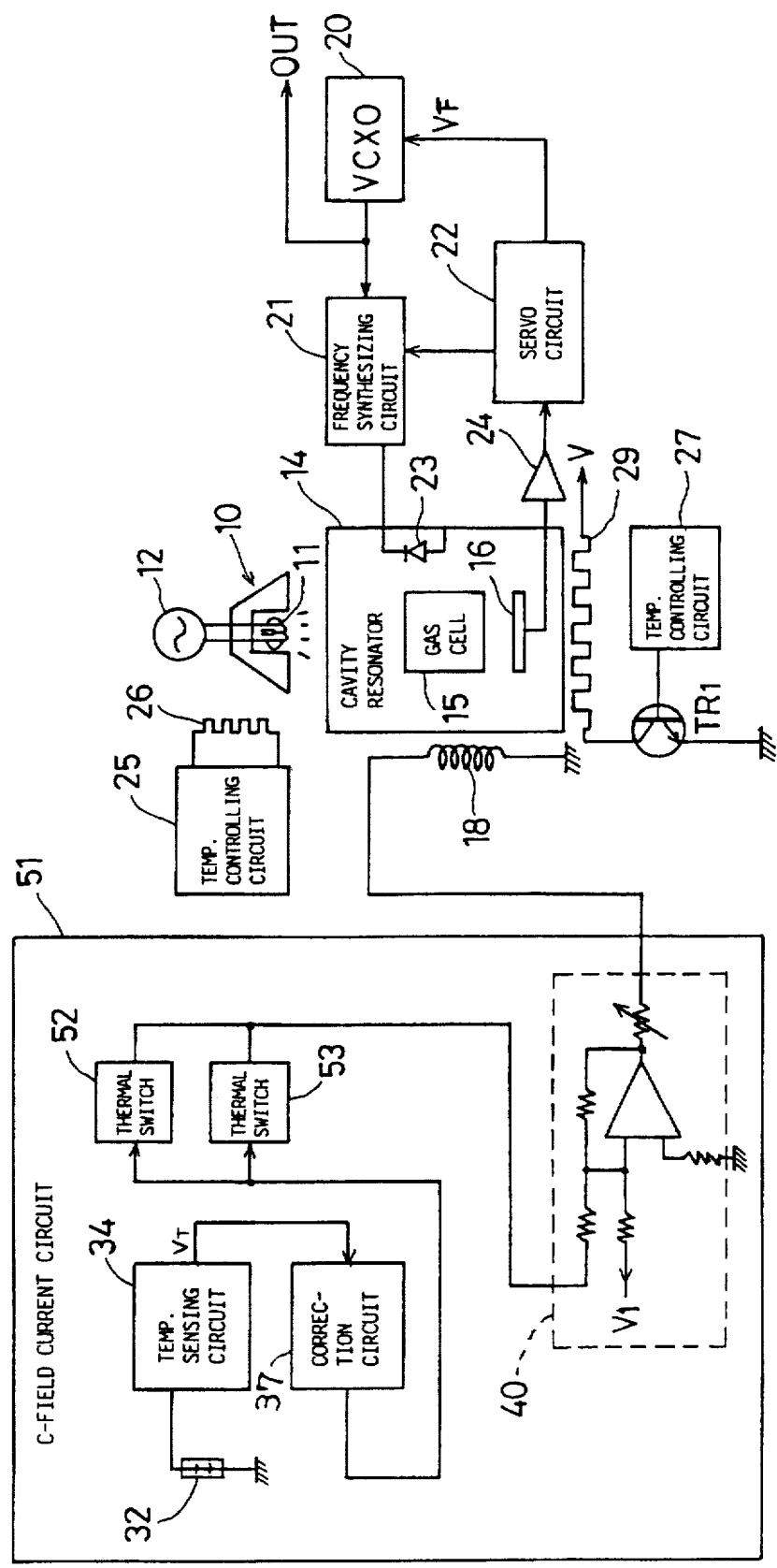
FIG. 10 is an illustration of a structure of a rubidium atom oscillator according to a third embodiment of the present invention.

A description will now be given, with reference to FIG. 10, of a third embodiment of the present invention. FIG. 10 is an illustration of a structure of a rubidium atom oscillator according to the third embodiment of the present invention. In FIG. 10, parts that are the same as the parts shown in FIG. 4 are given the same reference numerals, and descriptions thereof will be omitted.

In this embodiment, the temperature sensing circuit 34 in a C-field current circuit 51 outputs the temperature signal $V_t$ having the voltage $V_T$ which is responsive to the ambient temperature sensed by the temperature sensor 32. The temperature signal $V_t$ is supplied to the correction circuit 37. The correction circuit 37 generates and outputs a correction signal having a voltage responsive to the temperature signal $V_t$. The correction signal is supplied to thermal switches 52 and 53. The thermal switch 52 is turned on when the ambient temperature is below the lower-limit temperature $T_L$. The thermal switch 53 is turned on when the ambient temperature exceeds the upper-limit temperature $T_H$. Accordingly, the correction signal output from the correction circuit is supplied to the adder 40 when the ambient temperature is below the lower-limit temperature $T_L$ or the ambient temperature exceeds the upper-limit temperature $T_H$.

The adder 40 supplies a constant current determined by the input voltage $V_1$ to the C-field coil 18 when the ambient temperature is within the temperature range from the lower-limit temperature $T_L$ to the upper-limit temperature $T_H$. Thus, the static magnetic field in the cavity resonator 14 is maintained to be constant. If the ambient temperature exceeds the upper-limit temperature $T_H$ or the ambient temperature is below the lower-limit temperature $T_L$, the adder 40 supplies to the C-field coil 18 a current determined by a value obtained by adding a correction signal voltage to the input voltage $V_1$. Thus, the static magnetic field in the cavity resonator 14 is varied to shift the resonance frequency. Thus, as indicated by the solid line in FIG. 6, the frequency change outside the normal operation temperature range from $T_L$ to $T_H$ is suppressed.

Figure 11:
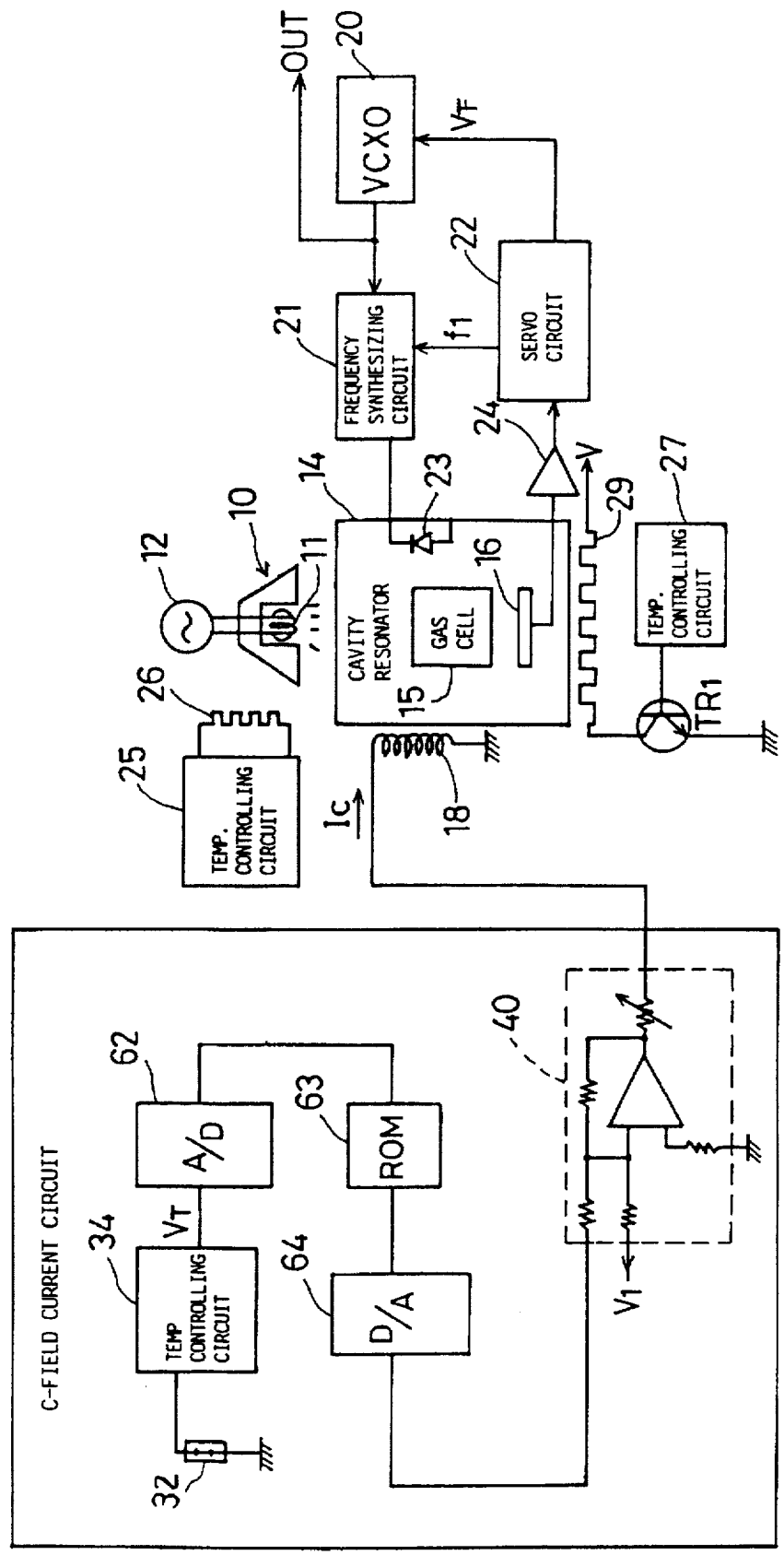
FIG. 11 is an illustration of a structure of a rubidium atom oscillator according to a fourth embodiment of the present invention.

A description will now be given, with reference to FIG. 11, of a fourth embodiment of the present invention. FIG. 11 is an illustration of a structure of a rubidium atom oscillator according to the fourth embodiment of the present invention. In FIG. 11, parts that are the same as the parts shown in FIG. 4 are given the same reference numerals, and descriptions thereof will be omitted.

In this embodiment, the temperature sensing circuit 34 in a C-field current circuit 61 outputs the temperature signal $V_t$ having the voltage $V_T$ which is responsive to the ambient temperature sensed by the temperature sensor 32. The temperature signal $V_t$ is converted into a digital signal by an analog-to-digital (A/D) converter 62. The digital signal is supplied to a read-only memory (ROM) 63 as address data. The ROM 63 stores correction data which takes a value of zero when the ambient temperature is within the temperature range from the lower-limit temperature. $T_L$ to the upper-limit temperature $T_H$ and takes a value responsive to the ambient temperature when the ambient temperature is below the lower-limit temperature $T_L$ or the ambient temperature exceeds the upper-limit temperature $T_H$. The correction data is read out from the ROM 63 by referring to the digital signal. An output of the ROM 63 is converted into an analog signal by a digital-to-analog converter 64, and is supplied to the adder 40.

The adder 40 supplies a constant current determined by the input voltage $V_1$ to the C-field coil 18 when the ambient temperature is within the temperature range from the lower-limit temperature $T_L$ to the upper-limit temperature $T_H$. Thus, the static magnetic field in the cavity resonator 14 is maintained to be constant. If the ambient temperature exceeds the upper-limit temperature $T_H$ or the ambient temperature is below the lower-limit temperature $T_L$, the adder 40 supplies to the C-field coil 18 a current determined by a value obtained by adding a correction signal voltage to the input voltage $V_1$. Thus, the static magnetic field in the cavity resonator 14 is varied to shift the resonance frequency. Thus, as indicated by the solid line in FIG. 6, the frequency change outside the normal operation temperature range from $T_L$ to $T_H$ is suppressed.

Figure 12:
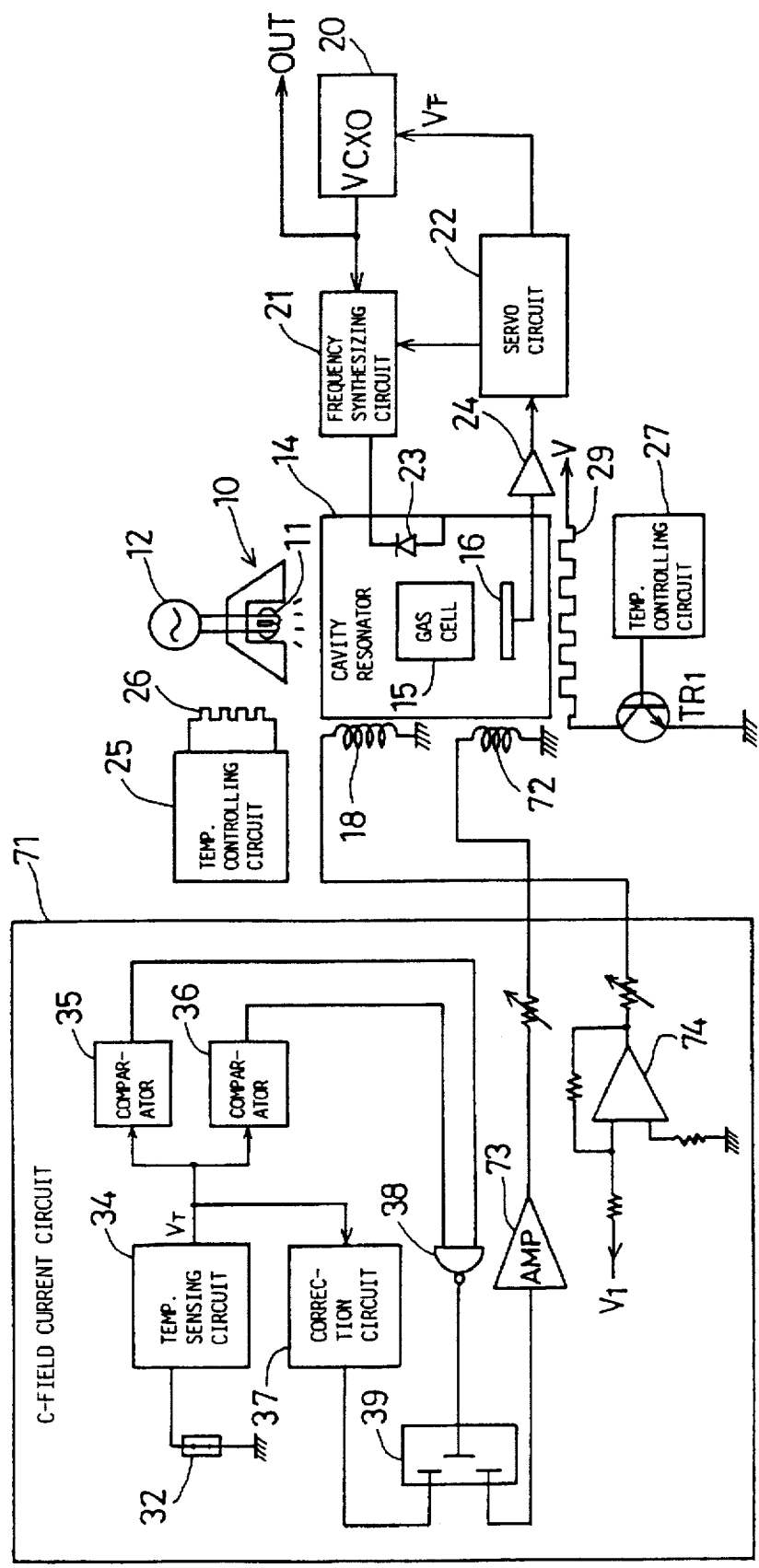
FIG. 12 is an illustration of a structure of a rubidium atom oscillator according to a fifth embodiment of the present invention.

A description will now be given, with reference to FIG. 12, of a fifth embodiment of the present invention. FIG. 12 is an illustration showing a structure of a rubidium atom oscillator according to the fifth embodiment of the present invention. In FIG. 12, parts that are the same as the parts shown in FIG. 4 are given the same reference numerals, and descriptions thereof will be omitted. In this embodiment, a correction coil 72 is provided to the cavity resonator 14 separately from the C-field coil 18.

The temperature sensing circuit 34 in a C-field current circuit 71 outputs the temperature signal $V_t$ having the voltage $V_T$ which is responsive to the ambient temperature sensed by the temperature sensor 32. The temperature signal $V_t$ is supplied to the comparators 35 and 36 and the correction circuit 37. The comparator 35 generates an output signal in accordance with the temperature signal $V_t$. That is, as indicated by the dotted line Ia in FIG. 5, the output signal from the comparator 35 is at a low level when the voltage $V_T$ is less than a predetermined voltage $V_{TL}$ and the ambient temperature is below the lower-limit temperature $T_L$. The comparator 36 generates an output signal in accordance with the temperature signal $V_t$. As indicated by the solid line Ib in FIG. 5, the output signal from the comparator 36 is at a low level when the voltage $V_T$ is greater than a predetermined voltage $V_{TH}$ and the ambient temperature exceeds the upper-limit temperature $T_H$.

The output signals from the comparators 35 and 36 are supplied to the NAND circuit 38. The NAND circuit 38 generates a switching signal which is turned to a high level when only one of the output signals from the comparators 35 and 36 is at the low level. The switching signal is supplied to the analog switch 39. The analog switch 39 becomes conductive when the high-level switching signal is input from the NAND circuit 38 so as to supply an output of the correction circuit 37 to a buffer amplifier 73. The correction circuit 37 generates a correction signal having a voltage responsive to the temperature signal $V_r$. The correction signal is supplied to the buffer amplifier 73 via the analog switch 39 when the ambient temperature exceeds the upper-limit temperature $T_H$ or the ambient temperature is below the lower-limit temperature $T_L$.

The buffer amplifier 74 supplies a constant current determined by an input voltage $V_1$ to the C-field coil 18 when the ambient temperature is within the temperature range from the lower-limit temperature $T_L$ to the upper-limit temperature $T_H$. Thus, the static magnetic field in the cavity resonator 14 is maintained to be constant. If the ambient temperature exceeds the upper-limit temperature $T_H$ or the ambient temperature is below the lower-limit temperature $T_L$, the buffer amplifier 73 supplies to the correction coil 72 a current determined by a correction signal voltage. Thus, the static magnetic field in the cavity resonator 14 is varied to shift the resonance frequency. Thus, as indicated by the solid line in FIG. 6, the frequency change outside the normal operation temperature range from $T_L$ to $T_H$ is suppressed.

Figure 13:
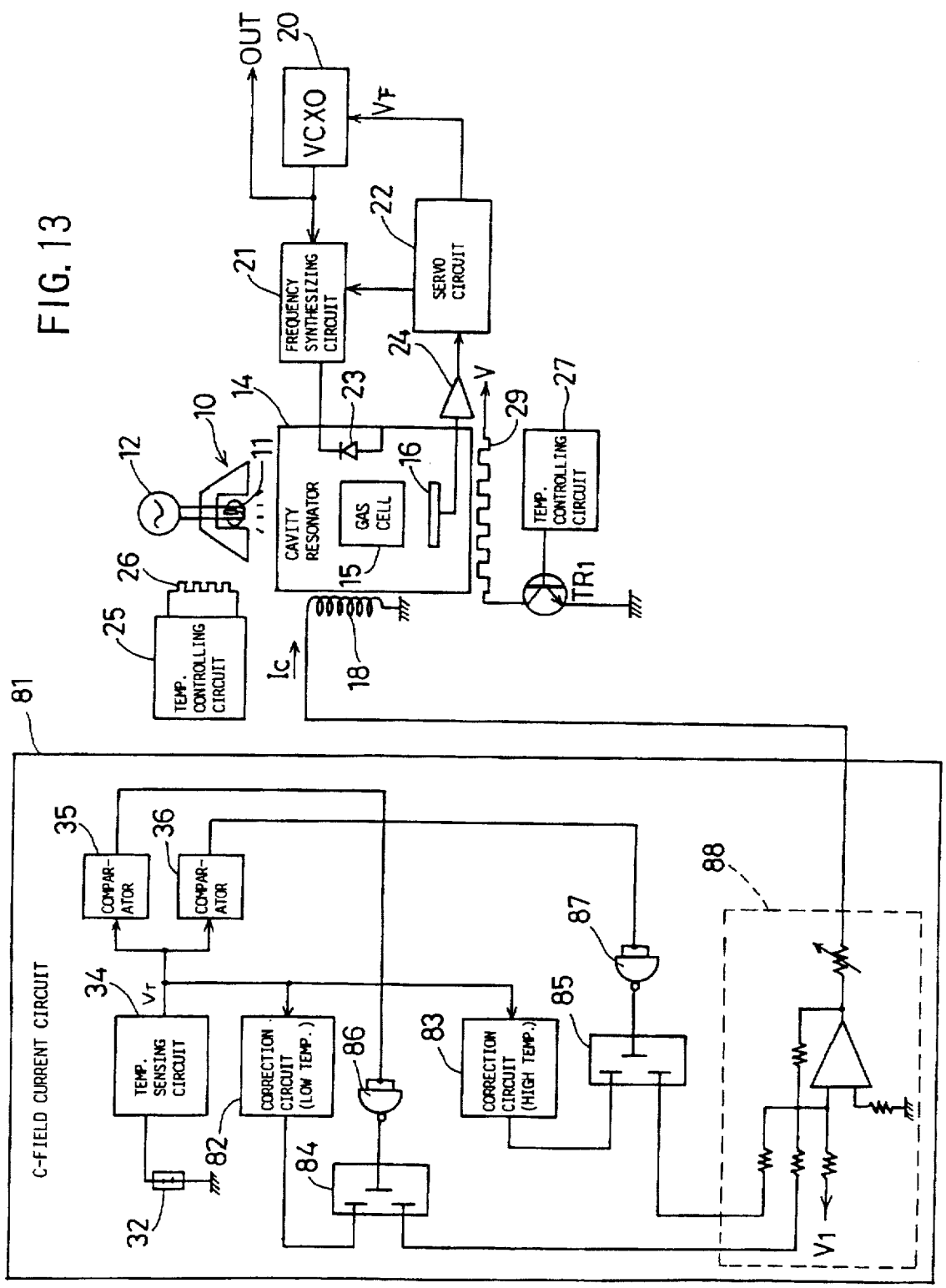
FIG. 13 is an illustration of a structure of a rubidium atom oscillator according to a sixth embodiment of the present invention.

A description will now be given, with reference to FIG. 13, of a sixth embodiment of the present invention. FIG. 13 is an illustration of a structure of a rubidium atom oscillator according to the sixth embodiment of the present invention. In FIG. 13, parts that are the same as the parts shown in FIG. 4 are given the same reference numerals, and descriptions thereof will be omitted.

In this embodiment, the temperature sensing circuit 34 in a C-field current circuit 81 outputs the temperature signal $V_r$ having the voltage $V_T$ which is responsive to the ambient temperature sensed by the temperature sensor 32. The temperature signal $V_r$ is supplied to the comparators 35 and 36 and first and second correction circuits 82 and 83, respectively. The comparator 35 generates an output signal in accordance with the temperature signal $V_r$. That is, as indicated by the dotted line I$a$ in FIG. 5, the output signal from the comparator 35 is at a low level when the voltage $V_T$ is less than a predetermined voltage $V_{TL}$ and the ambient temperature is below the lower-limit temperature $T_L$. The comparator 36 generates an output signal in accordance with the temperature signal $V_r$. As indicated by the solid line I$b$ in FIG. 5, the output signal from the comparator 36 is at a low level when the voltage $V_T$ is greater than a predetermined voltage $V_{TH}$ and the ambient temperature exceeds the upper-limit temperature $T_H$.

The output signals from the comparators 35 and 36 are supplied to analog switches 84 and 85 after being inverted by NAND circuits 86 and 87, respectively. Each of the analog switches 84 and 85 becomes conductive when the high-level switching signal is input from the respective NAND circuit 86 or 87 so as to supply an output of a respective correction circuit 82 or 83 to an adder 88. Each of the correction circuits 82 and 83 generates a correction signal having a voltage responsive to the temperature signal $V_r$. An output signal of the correction circuit 82 is supplied to the adder 88 via the analog switch 84 when the ambient temperature is below the lower-limit temperature $T_L$. An output signal of the correction circuit 83 is supplied to the adder 88 via the analog switch 85 when the ambient temperature exceeds the upper-limit temperature $T_H$.

The adder 88 supplies a constant current determined by an input voltage $V_1$ to the C-field coil 18 when the ambient temperature is within the temperature range from the lower-limit temperature $T_L$ to the upper-limit temperature $T_H$. Thus, the static magnetic field in the cavity resonator 14 is maintained to be constant. If the ambient temperature exceeds the upper-limit temperature $T_H$ or the ambient temperature is below the lower-limit temperature $T_L$, the adder 88 supplies to the C-field coil 18 a current determined by a value obtained by adding a correction signal voltage to the input voltage $V_1$. Thus, the static magnetic field in the cavity resonator 14 is varied to shift the resonance frequency. Thus, as indicated by a dotted line in FIG. 14, the frequency change outside the normal operation temperature range from $T_L$ to $T_H$ is suppressed.

Figure 14:
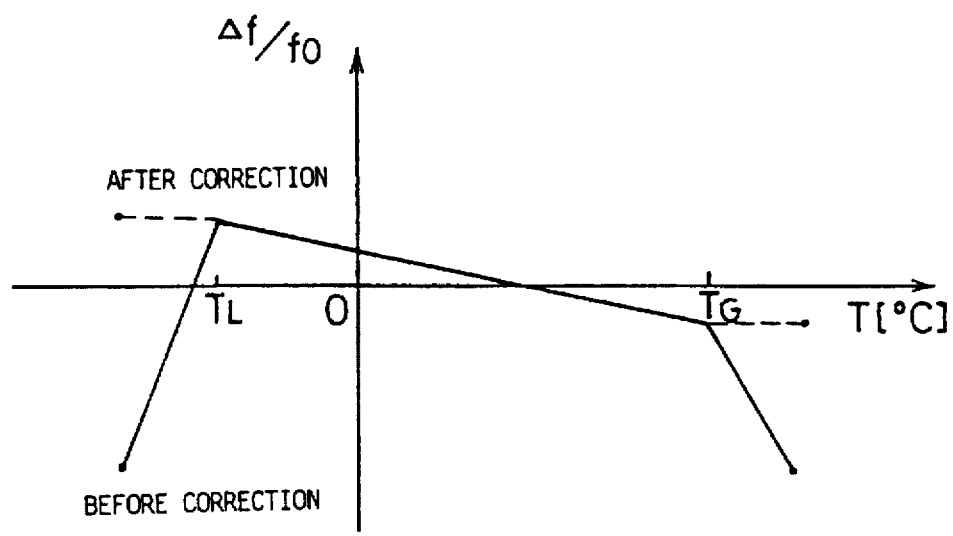
FIG. 14 is a graph showing a frequency change when an ambient temperature is varied.

In this embodiment, since two correction circuits 82 and 83 are provided, the frequency change can be suppressed even if a change rate of the frequency when the ambient temperature is below the lower-limit temperature $T_L$ is different from a change rate of the frequency when the ambient temperature exceeds the upper-limit temperature $T_H$ as shown in a solid line in FIG. 14.

Figure 15:
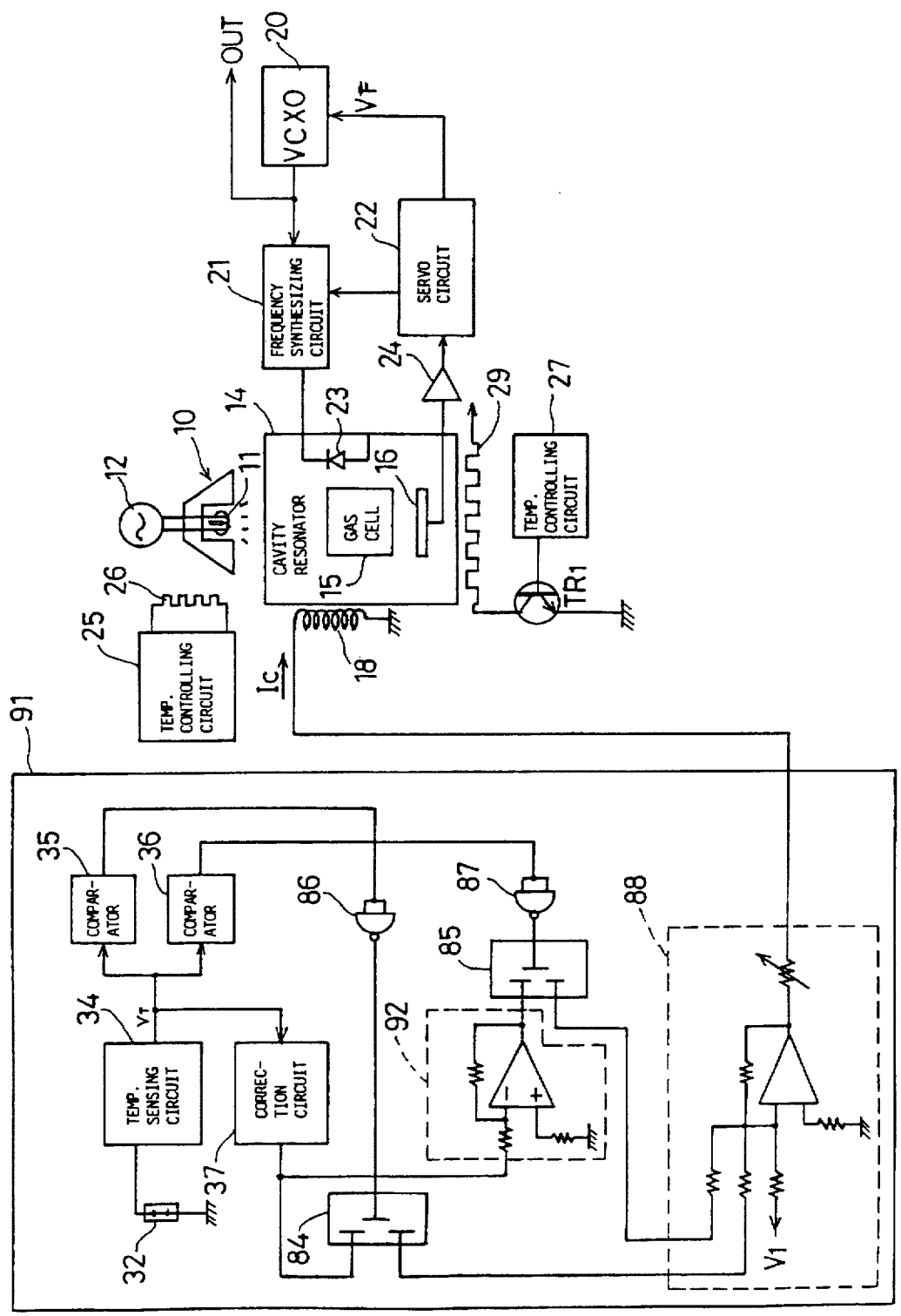
FIG. 15 is an illustration of a structure of a rubidium atom oscillator according to a seventh embodiment of the present invention.

A description will now be given, with reference to FIG. 15, of a seventh embodiment of the present invention. FIG. 15 is an illustration showing a structure of a rubidium atom oscillator according to the seventh embodiment of the present invention. In FIG. 15, parts that are the same as the parts shown in FIG. 4 and 13 are given the same reference numerals, and descriptions thereof will be omitted.

In this embodiment, the temperature sensing circuit 34 in a C-field current circuit 91 outputs the temperature signal $V_r$ having the voltage $V_T$ which is responsive to the ambient temperature sensed by the temperature sensor 32. The temperature signal $V_r$ is supplied to the comparators 35 and 36 and the correction circuit 37. The comparator 35 generates an output signal in accordance with the temperature signal $V_r$. That is, as indicated by the dotted line I$a$ in FIG. 5, the output signal from the comparator 35 is at a low level when the voltage $V_T$ is less than a predetermined voltage $V_{TL}$ and the ambient temperature is below the lower-limit temperature $T_L$. The comparator 36 generates an output signal in accordance with the temperature signal $V_r$. As indicated by the solid line I$b$ in FIG. 5, the output signal from the comparator 36 is at a low level when the voltage $V_T$ is greater than a predetermined voltage $V_{TH}$ and the ambient temperature exceeds the upper-limit temperature $T_H$.

The output signals from the comparators 35 and 36 are supplied to the analog switches 84 and 85 after being inverted by the NAND circuits 86 and 87, respectively. Each of the analog switches 84 and 85 becomes conductive when the high-level switching signal is input from the respective NAND circuit 86 or 87 so as to supply one of outputs of the correction circuit 37 and an inverting amplifier 92. The correction circuit 37 generates a correction signal having a voltage responsive to the temperature signal $V_r$. An output signal of the correction circuit 37 is supplied to the adder 88 via the analog switch 84 when the ambient temperature is below the lower-limit temperature $T_L$. An output signal of the inverting amplifier 92 is supplied to the adder 88 via the analog switch 85 when the ambient temperature exceeds the upper-limit temperature $T_H$.

The adder 88 supplies a constant current determined by an input voltage $V_1$ to the C-field coil 18 when the ambient temperature is within the temperature range from the lower-limit temperature $T_L$ to the upper-limit temperature $T_H$. Thus, the static magnetic field in the cavity resonator 14 is maintained to be constant. If the ambient temperature exceeds the upper-limit temperature $T_H$ or the ambient temperature is below the lower-limit temperature $T_L$, the adder 88 supplies to the C-field coil 18 a current determined by a value obtained by adding a correction signal voltage to the input voltage $V_1$. Thus, the static magnetic field in the cavity resonator 14 is varied to shift the resonance frequency. Thus, as indicated by a dotted line in FIG. 14, the frequency change outside the normal operation temperature range from $T_L$ to $T_H$ is suppressed.

In this embodiment, since the inverting amplifier 92 is provided, the frequency change can be suppressed even if a change rate of the frequency when the ambient temperature is below the lower-limit temperature $T_L$ is different from a change rate of the frequency when the ambient temperature exceeds the upper-limit temperature $T_H$ as shown in the solid line in FIG. 14. Additionally, a single correction circuit is used in this embodiment.

Figure 16:
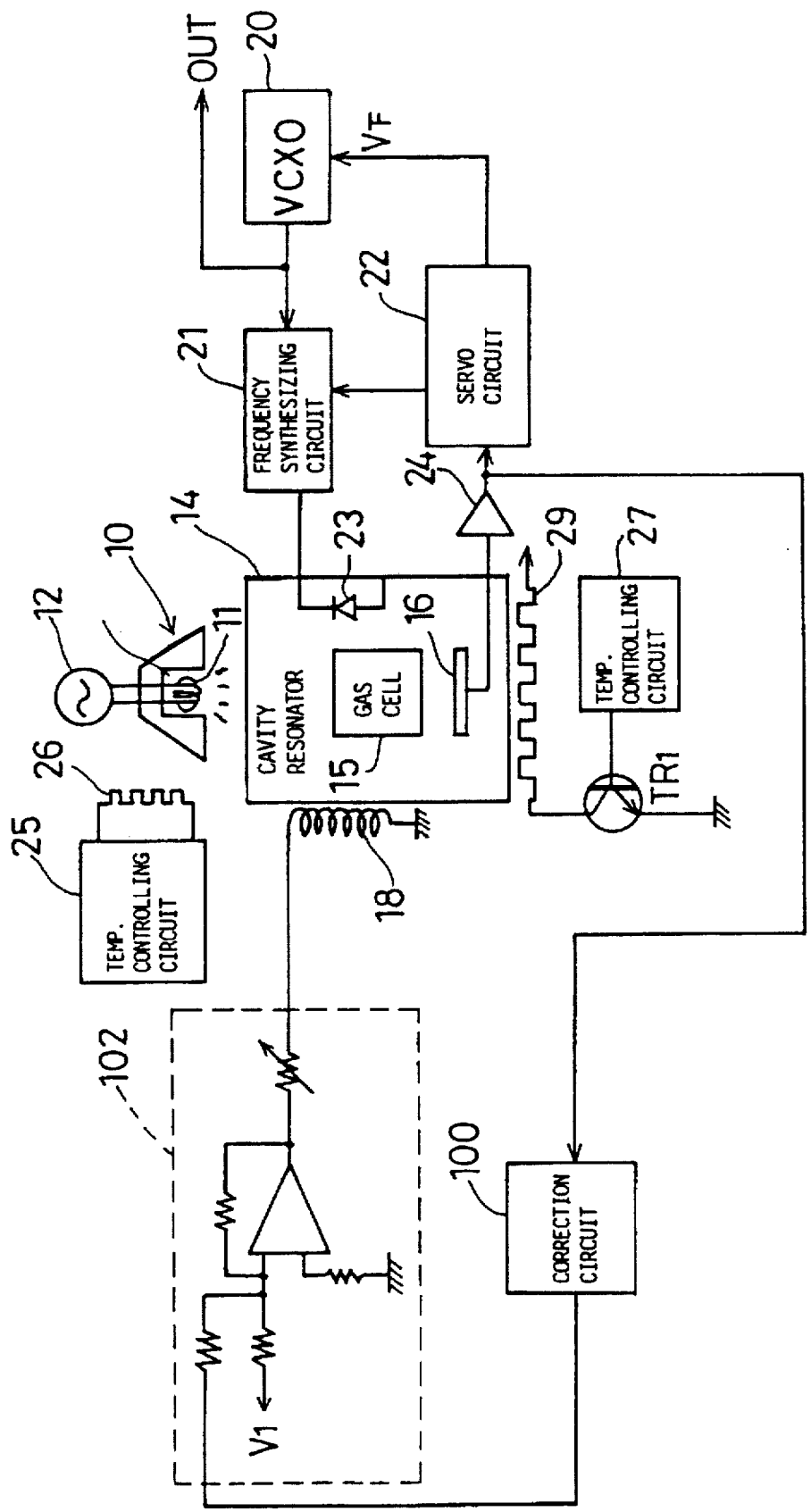
FIG. 16 is an illustration of a structure of a rubidium atom oscillator according to an eighth embodiment of the present invention.

A description will now be given, with reference to FIG. 16, of an eighth embodiment of the present invention. FIG. 16 is an illustration of a structure of a rubidium atom oscillator according to the eighth embodiment of the present invention. In FIG. 16, parts that are the same as the parts shown in FIG. 4 are given the same reference numerals, and descriptions thereof will be omitted.

In this embodiment, the detection signal output from the photodetector 16 in the cavity resonator 14 is supplied to a correction circuit 100 as well as the servo circuit 22 after being amplified by the preamplifier 24. The detection signal output from the photodetector 16 corresponds to the amount of light radiated by the rubidium lamp 10.

Figure 17:
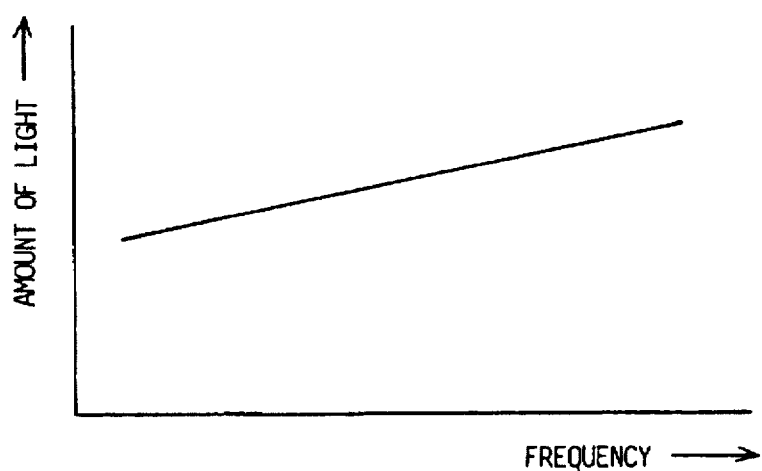
FIG. 17 is a graph showing a relationship between an amount of light from a rubidium lamp and a frequency of an output from the rubidium atom oscillator.

FIG. 17 is a graph showing a relationship between the amount of light detected by the photodetector 16 and a frequency of an output of a rubidium atom oscillator. As shown in FIG. 17, the frequency of the output of the rubidium atom oscillator is decreased as the amount of light radiated by the rubidium lamp 11 is decreased. In order to correct the decrease in the frequency, the correction circuit 100 generates a correction signal which increases the frequency when the amount of light from the rubidium lamp 11 is decreased. The correction signal is supplied to an adder 102. The adder 102 adds a voltage of the correction signal to an input voltage V1, and supplies to the C-field coil 18 a current determined by a result of the addition of the adder 102. Thus, the static magnetic field in the cavity resonator 14 is varied, causing a shift of the resonance frequency. Thus, if the amount of light from the rubidium lamp 11 is decreased due to aging, a shift of the frequency is prevented by controlling the current supplied to the C-field coil 18. Accordingly, the rubidium atom oscillator according to the present embodiment has long service life with a stabilized frequency.

Figure 18:
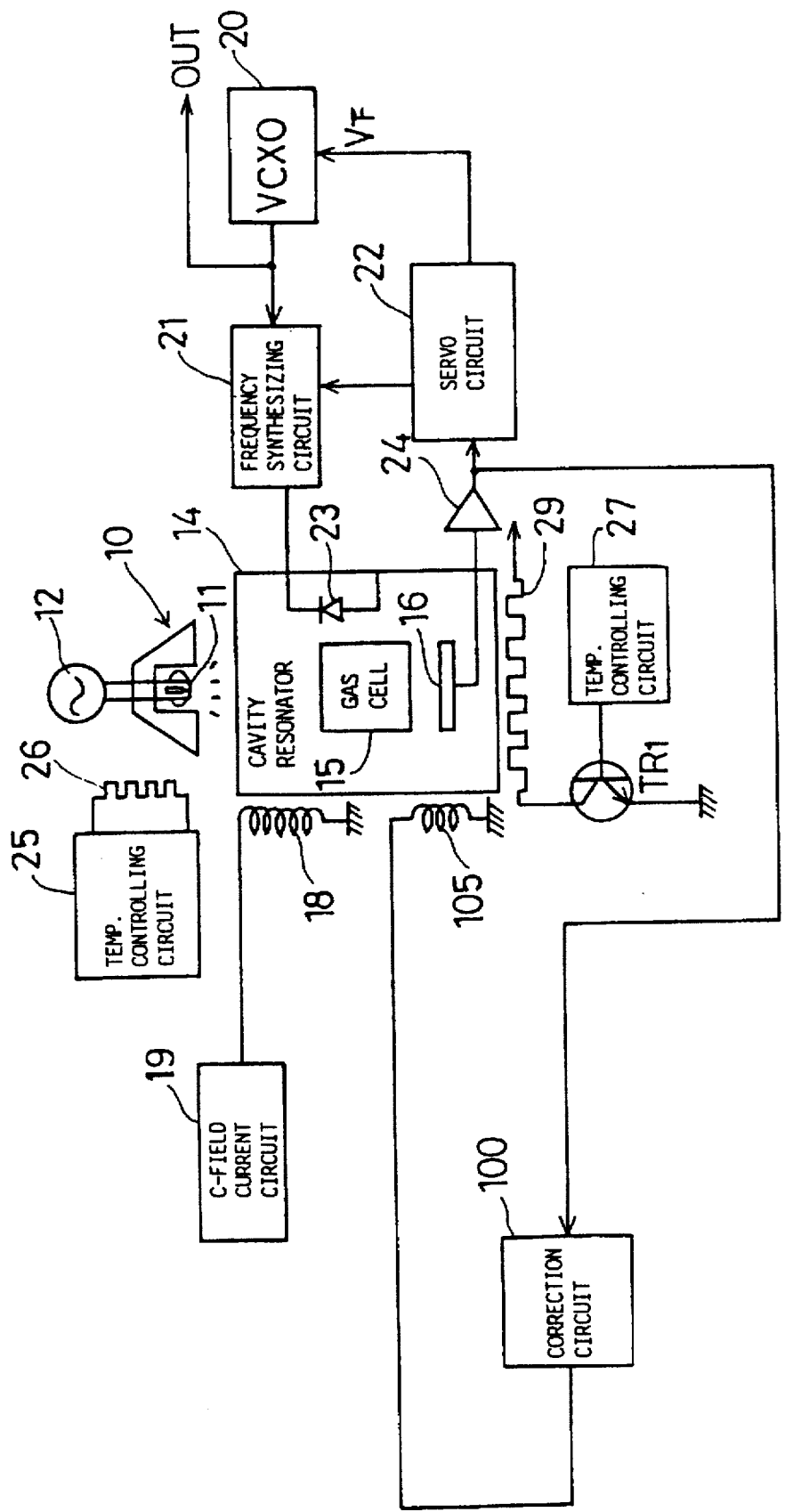
FIG. 18 is an illustration of a structure of a rubidium atom oscillator according to a ninth embodiment of the present invention.

A description will now be given, with reference to FIG. 18, of a ninth embodiment of the present invention. FIG. 18 is an illustration of a structure of a rubidium atom oscillator according to the ninth embodiment of the present invention. In FIG. 18, parts that are the same as the parts shown in FIG. 4 are given the same reference numerals, and descriptions thereof will be omitted.

In this embodiment, a correction coil 105 is provided to the cavity resonator 14 separately from the C-field coil 18. A detection signal output from the photodetector 16 is amplified by the preamplifier 24, and supplied to the correction circuit 100 as well as the servo circuit 22. The output signal of the photodetector corresponds to the amount of light radiated by the rubidium lamp 11.

As shown in FIG. 17, the frequency of the output of the rubidium atom oscillator is decreased as the amount of light radiated by the rubidium lamp 11 is decreased. In order to correct the decrease in the frequency, the correction circuit 100 generates a correction signal which increases the frequency when the amount of light from the rubidium lamp 11 is decreased. The correction signal is supplied to the correction coil 105 so that a current determined by a voltage of the correction signal flows in the correction coil 105. Thus, the static magnetic field in the cavity resonator 14 is varied, causing a shift of the resonance frequency. Thus, if the amount of light from the rubidium lamp 11 is decreased due to aging, a shift of the frequency is prevented by controlling the current supplied to the correction coil 105. Accordingly, the rubidium atom oscillator according to the present embodiment has a long service life with a stabilized frequency.

Figure 19:
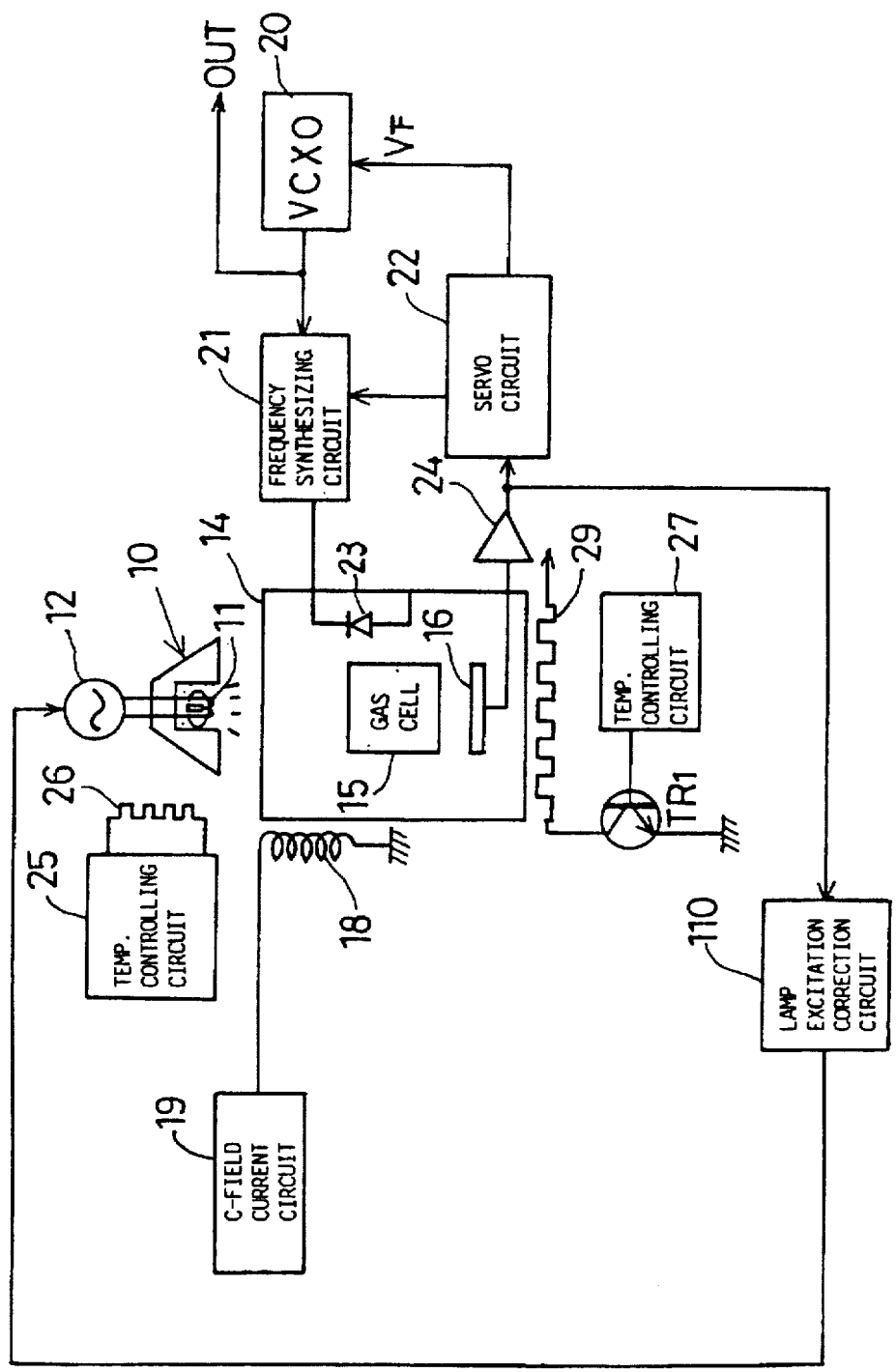
FIG. 19 is an illustration of a structure of a rubidium atom oscillator according to a tenth embodiment of the present invention.

A description will now be given, with reference to FIG. 19, of a tenth embodiment of the present invention. FIG. 19 is an illustration of a structure of a rubidium atom oscillator according to the tenth embodiment of the present invention. In FIG. 19, parts that are the same as the parts shown in FIG. 4 are given the same reference numerals, and descriptions thereof will be omitted.

In this embodiment, the detection signal output from the photodetector 16 in the cavity resonator 14 is supplied to a lamp excitation correction circuit 110 as well as the servo circuit 22 after being amplified by the preamplifier 24. The detection signal output form the photodetector 16 corresponds to the amount of light radiated by the rubidium lamp 10.

The lamp excitation correction circuit 110 integrates the detection signal of the photodetector 16. The lamp excitation correction circuit 110 controls the voltage supplied to the high-frequency source 12 so that the result of the integral is always constant. Thus, the amount of light from the rubidium lamp 11 is maintained to be constant.

Thus, a decrease in the amount of light from the rubidium lamp 11 due to aging is prevented. Accordingly, the rubidium atom oscillator according to the present embodiment has a long service life with a stabilized frequency.

The present invention is not limited to the specifically disclosed embodiments, and variations and modifications may be made without departing from the scope of the present invention.

What is claimed is:

1. A rubidium atom oscillator oscillating a microwave having a predetermined stable frequency by using an optical pumping effect of rubidium gas, said rubidium atom oscillator comprising:

a rubidium lamp radiating a resonance light;

a cavity resonator accommodating a gas cell containing rubidium gas and a photodetector detecting an amount of the resonance light passing through said gas cell;

temperature determining means for determining whether or not an ambient temperature of said cavity resonator is within a predetermined temperature range between a lower-limit temperature and an upper-limit temperature;

temperature correction signal generating means for generating a temperature correction signal based on a determination of said temperature determining means; and current supplying means for supplying a current determined by the temperature correction signal to a coil surrounding said cavity resonator, said coil generating a magnetic field in said cavity resonator, wherein said temperature determining means includes a temperature sensing circuit and comparing means, said temperature sensing circuit generating a temperature signal having a voltage responsive to the ambient temperature sensed by a temperature sensor, said comparing means comparing the temperature signal with predetermined voltage values corresponding to said upper-limit temperature and said lower-limit temperature to determine whether the ambient temperature is within said predetermined temperature range.

2. The rubidium atom oscillator as claimed in claim 1, wherein said comparing means comprises a first comparator and a second comparator, said first comparator comparing the temperature signal with the voltage value corresponding to said lower-limit temperature, said second comparator comparing the temperature signal with the voltage value corresponding to said upper-limit temperature.

3. A rubidium atom oscillator oscillating a microwave having a predetermined stable frequency by using an optical pumping effect of rubidium gas, said rubidium atom oscillator comprising:

a rubidium lamp radiating a resonance light;

a cavity resonator accommodating a gas cell containing rubidium gas and a photodetector detecting an amount of the resonance light passing through said gas cell;

temperature determining means for determining whether or not an ambient temperature of said cavity resonator is within a predetermined temperature range between a lower-limit temperature and an upper-limit temperature;

temperature correction signal generating means for generating a temperature correction signal based on a determination of said temperature determining means; and current supplying means for supplying a current determined by the temperature correction signal to a coil surrounding said cavity resonator, said coil generating a magnetic field in said cavity resonator, a heater heating said cavity resonator by being supplied with a voltage responsive to the ambient temperature, said temperature determining means including comparing means comparing the voltage supplied to said heater with predetermined voltage values corresponding to said upper-limit temperature and said lower-limit temperature to determine whether the ambient temperature is within said predetermined temperature range.

4. The rubidium atom oscillator as claimed in claim 3, wherein said comparing means comprises a first comparator and a second comparator, said first comparator comparing the voltage supplied to said heater with the voltage value corresponding to said lower-limit temperature, said second comparator comparing the voltage supplied to said heater with the voltage value corresponding to said upper-limit temperature.

5. A rubidium atom oscillator oscillating a microwave having a predetermined stable frequency by using an optical pumping effect of rubidium gas, said rubidium atom oscillator comprising:

a rubidium lamp radiating a resonance light;

a cavity resonator accommodating a gas cell containing rubidium gas and a photodetector detecting an amount of the resonance light passing through said gas cell;

temperature determining means for determining whether or not an ambient temperature of said cavity resonator is within a predetermined temperature range between a lower-limit temperature and an upper-limit temperature;

temperature correction signal generating means for generating a temperature correction signal based on a determination of said temperature determining means; and current supplying means for supplying a current determined by the temperature correction signal to a coil surrounding said cavity resonator, said coil generating a magnetic field in said cavity resonator, wherein said temperature determining means includes thermal switch means which is operated at said lower-limit temperature and said upper-limit temperature.

6. The rubidium atom oscillator as claimed in claim 5, wherein said thermal switch means comprises a first thermal switch and a second thermal switch, said first thermal switch being conductive when the ambient temperature is below said lower-limit temperature, said second thermal switch being conductive when the ambient temperature exceeds said upper-limit temperature.

7. A rubidium atom oscillator oscillating a microwave having a predetermined stable frequency by using an optical pumping effect of rubidium gas, said rubidium atom oscillator comprising:

a rubidium lamp radiating a resonance light;

a cavity resonator accommodating a gas cell containing rubidium gas and a photodetector detecting an amount of the resonance light passing through said gas cell;

temperature determining means for determining whether or not an ambient temperature of said cavity resonator is within a predetermined temperature range between a lower-limit temperature and an upper-limit temperature;

temperature correction signal generating means for generating a temperature correction signal based on a determination of said temperature determining means; and current supplying means for supplying a current determined by the temperature correction signal to a coil surrounding said cavity resonator, said coil generating a magnetic field in said cavity resonator, wherein said temperature determining means and said temperature correction signal generating means together constitute storing means for storing data of the temperature correction signal for various ambient temperatures.

8. A rubidium atom oscillator oscillating a microwave having a predetermined stable frequency by using an optical pumping effect of rubidium gas, said rubidium atom oscillator comprising:

a rubidium lamp radiating a resonance light;

a cavity resonator accommodating a gas cell containing rubidium gas and a photodetector detecting an amount of the resonance light passing through said gas cell;

temperature determining means for determining whether or not an ambient temperature of said cavity resonator is within a predetermined temperature range between a lower-limit temperature and an upper-limit temperature;

temperature correction signal generating means for generating a temperature correction signal based on a determination of said temperature determining means; and current supplying means for supplying a current determined by the temperature correction signal to a coil surrounding said cavity resonator, said coil generating a magnetic field in said cavity resonator, wherein said temperature correction signal generating means includes a first correction circuit and a second correction circuit, said first correction circuit generating a first temperature correction signal when the ambient temperature exceeds said upper-limit temperature, said second correction circuit generating a second temperature correction signal when the ambient temperature is below said lower-limit temperature.

9. A rubidium atom oscillator oscillating a microwave having a predetermined stable frequency by using an optical pumping effect of rubidium gas, said rubidium atom oscillator comprising:

a rubidium lamp radiating a resonance light;

a cavity resonator accommodating a gas cell containing rubidium gas and a photodetector detecting an amount of the resonance light passing through said gas cell;

temperature determining means for determining whether or not an ambient temperature of said cavity resonator is within a predetermined temperature range between a lower-limit temperature and an upper-limit temperature;

temperature correction signal generating means for generating a temperature correction signal based on a determination of said temperature determining means; and current supplying means for supplying a current determined by the temperature correction signal to a coil surrounding said cavity resonator, said coil generating a magnetic field in said cavity resonator, wherein said temperature correction signal generating means includes a correction circuit and an inverting amplifier, said correction circuit generating the temperature correction signal, said inverting amplifier inverting and amplifying the temperature correction signal when the ambient temperature exceeds said upper-limit temperature.

10. A rubidium atom oscillator oscillating a microwave having a predetermined stable frequency by using an optical pumping effect of rubidium gas, said rubidium atom oscillator comprising:

a rubidium lamp radiating a resonance light;

a cavity resonator accommodating a gas cell containing rubidium gas and a photodetector detecting an amount of the resonance light passing through said gas cell;

temperature determining means for determining whether or not an ambient temperature of said cavity resonator is within a predetermined temperature range between a lower-limit temperature and an upper-limit temperature;

temperature correction signal generating means for generating a temperature correction signal based on a determination of said temperature determining means; and current supplying means for supplying a current determined by the temperature correction signal to a coil surrounding said cavity resonator, said coil generating a magnetic field in said cavity resonator, wherein said temperature correction signal generating means includes a correction circuit and an inverting amplifier, said correction circuit generating the temperature correction signal, said inverting amplifier inverting and amplifying the temperature correction signal when the ambient temperature is below said lower-limit temperature.

* * * * *